United States Patent

Umeyama et al.

[11] Patent Number: 5,311,141
[45] Date of Patent: May 10, 1994

[54] ACTIVE FILTER CIRCUIT

[75] Inventors: Takehiko Umeyama; Yasunori Sakaguchi, both of Hyogo, Japan

[73] Assignee: Mitsubishi Denki Kabushiki Kaisha, Tokyo, Japan

[21] Appl. No.: 903,965

[22] Filed: Jun. 26, 1992

[30] Foreign Application Priority Data

Nov. 29, 1991 [JP] Japan .................................. 3-316034

[51] Int. Cl.$^5$ ........................... H03F 1/32; H03K 5/00
[52] U.S. Cl. ..................................... 328/167; 307/520; 307/521; 330/107
[58] Field of Search .................... 307/520, 521, 491; 328/167; 330/107

[56] References Cited

U.S. PATENT DOCUMENTS

| | | | |
|---|---|---|---|
| 4,818,903 | 4/1989 | Kawano | 307/521 |
| 4,851,718 | 7/1989 | Hagino et al. | 307/520 |
| 4,881,043 | 11/1989 | Jason | 330/107 |
| 4,926,139 | 5/1990 | Anderson et al. | 330/107 |
| 5,001,441 | 3/1991 | Gen-Kuong | 330/107 |
| 5,124,592 | 6/1992 | Hagino | 328/167 |
| 5,192,884 | 3/1993 | Kusano | 328/167 |

FOREIGN PATENT DOCUMENTS 0479201  4/1992  European Pat. Off. ............ 307/521
2-268507  11/1990  Japan .

Primary Examiner—Timothy P. Callahan
Attorney, Agent, or Firm—Oblon, Spivak, McClelland, Maier & Neustadt

[57] ABSTRACT

An active filter having a frequency characteristics of the fewer variations of manufacturing and the least temperature dependency is provided. A differential amplifier is comprised of resistors 15 and 16 which have a resistance value $R_E$ and are connected in common to a current source 39 in proportion to $kT/(qR_0)$, together with transistors 13 and 14. The transistor 14 is connected to an active load comprised of transistors 18 and 19. The transistor 18 is connected to a current source 31 for producing a current in proportion to a capacity $C_0$ while the transistor 19 is connected to a current source 30 for producing a current of a remainder of the current produced by the current source 31 subtracted from the current in proportion to $1/R_a$. The transistor 19 is further connected to an internal capacitor 21 having capacity $C_1$. A frequency characteristics of the active filter circuit is determined by the ratio of resistance values $R_E$, $R_0$ and $R_a$ and the ratio of the capacities $C_0$ and $C_1$, and a term of an ambient temperature is cancelled.

30 Claims, 12 Drawing Sheets

ACTIVE FILTER CIRCUIT

BACKGROUND OF THE INVENTION

1. Field of the Invention

The present invention relates to an improvement of property variations and temperature dependency because of passive elements in an active filter circuit comprised of semiconductor integrated circuits.

FIG. 13 is a circuit diagram showing an embodiment of an active filter circuit which is a conventional primary lowpass filter.

Referring to FIG. 13, an input terminal 2 is connected to a base of an NPN transistor 13. A signal of dc bias voltage applied by a voltage source 4 superposed with an ac signal $V_i$ superposed is input to the input terminal 2.

The NPN transistor 13 has its collector connected to a power source 1 and its emitter connected through a resistor 15 (resistance value $R_E$) to a first terminal of a constant current source 17. A second terminal of the constant current source 17 is grounded. The constant current source 17 generates dc current $2I_3$.

The constant current source 17 has its first terminal connected to a first terminal of a resistor 16 (resistance value $R_E$), of which second terminal is connected to an emitter of an NPN transistor 14. The NPN transistor 14 has its base connected to an output terminal 24 and its collector connected to respective emitters of NPN transistors 18 and 19. The NPN transistor 18 has its collector connected to the power source 1 and its base connected to an emitter of an NPN transistor 7. The NPN transistor 19 has its collector connected to a first terminal of a constant current source 20, of which second terminal is connected to the power source 1. The collector of the NPN transistor 19 is also connected to a base of an NPN transistor 22 and a first terminal of a capacitor 21 (capacity $C_1$). A second terminal of the capacitor 21 is grounded.

An NPN transistor 22 has its collector connected to the power source 1 and its emitter connected to an output terminal 24 and a first terminal of a constant current source 23, of which second terminal is grounded. The NPN transistor 19 has its base connected to an emitter of an NPN transistor 6, while the NPN transistors 6 and 7 have their respective bases and collectors connected in common to a voltage source 5. The NPN transistor 6 has its emitter connected to a collector of an NPN transistor 9 while the NPN transistor 7 has its emitter connected to a collector of an NPN transistor 10. An emitter of the NPN transistor 9 is grounded through a resistor 11 (resistance value $R_1$) while an emitter of the NPN transistor 10 is grounded through a resistor 12 (resistance value $R_2$). The NPN transistors 9 and 10 have their respective bases connected in common to a voltage source 8.

In general, emitter current $I_E$ in transistors can be expressed as follows:

$$I_E = I_0 \exp\left[\frac{qV_{BE}}{kt}\right] \qquad (1)$$

where $V_{BE}$ is a base-emitter voltage, k is a Boltzmann's constant, T is an ambient temperature of transistors which are expressed by an absolute temperature, and q is an amount of electric charge of electrons. According to the formula 1, an emitter resistor $r_e$ of the transistors 13 and 14 can be expressed as follows:

$$r_e = \frac{kT/q}{I_3} \qquad (2)$$

Thus, utilizing the ac signal $V_i$ input to the input terminal 2 and an ac signal $V_o$ appearing at an output terminal, an ac component $I_{14C}$ of the collector current in the transistor 14 can be expressed as follows:

$$I_{14C} = \frac{V_i - V_o}{2R_E + 2r_e} = \frac{1}{2} \cdot \frac{V_i - V_o}{R_E + (kT/qI_3)} \qquad (3)$$

An ac component $I_{19C}$ of the collector current in the transistor 19 is determined by emitter currents $I_{6E}$ and $I_{7E}$ as follows:

$$I_{19C} = I_{14C} \times \frac{I_{7E}}{I_{6E} + I_{7E}} \qquad (4)$$

A value of the dc current from the current source 20 is set equal to that of the dc component of the collector current in the transistor 19.

An ac voltage $V_{22B}$ applied to a base of the transistor 22 can be expressed as follows:

$$V_{22B} = \frac{1}{j\omega C_1} \times I_{19C} \qquad (5)$$

$$\omega = 2\pi f$$

where f is a frequency of the signal $V_i$ and $\pi$ is a ratio of the circumference of a circle to its diameter.

The ac signal $V_o$ appearing in the output terminal 24 is equal to the ac voltage $V_{22B}$, and hence it can be expressed as follows:

$$V_o = \frac{1}{j\omega C_1} \times I_{19C} \qquad (6)$$

The formulae (2), (3), (4) and (6) together lead the following formula:

$$V_o = \frac{\frac{1}{j\omega C_1} \times \frac{I_{7E}}{I_{6E} + I_{7E}}}{2\left(R_E + \frac{kT/q}{I_3}\right) + \frac{1}{j\omega C_1} \times \frac{I_{7E}}{I_{6E} + I_{7E}}} \times V_i \qquad (7)$$

$$= \frac{\frac{1}{2} \times \frac{1}{j\omega C_1} \times \frac{1}{R_E + \frac{kT/q}{I_3}} \times \frac{I_{7E}}{I_{6E} + I_{7E}}}{1 + \frac{1}{2} \times \frac{1}{j\omega C_1} \times \frac{1}{R_E + \frac{kT/q}{I_3}} \times \frac{I_{7E}}{I_{6E} + I_{7E}}} \times V_i$$

$I_{6E}$ and $I_{7E}$ are determined by voltage $V_8$ of a voltage source 8 and resistance values $R_1$ and $R_2$, and they can be expressed as follows:

$$I_{6E} \approx \frac{V_8 - V_{BE9}}{R_1} \qquad (8)$$

$$I_{7E} = \frac{V_8 - V_{BE10}}{R_2} \qquad (9)$$

$V_{BE9}$ and $V_{BE10}$ are base-emitter voltages in the transistors 9 and 10.

A frequency characteristic of the dc signal $V_o$ output at the output terminal 24 is, as will be recognized in the formula 7, determined by the capacity $C_1$ of the capacitor 21 built in an semiconductor integrated circuit, the resistance value $R_E$ of the built-in resistors 15 and 16, the current $I_3$, the absolute temperature T, and the ratio of the emitted current $I_{6E}$ to the emitter current $I_{7E}$ within the integrated circuit.

A conventional active filter circuit is configured as mentioned above, and therefore, its frequency characteristic depends upon a capacity of a capacitor build in a semiconductor integrated circuit, a resistance value of built-in resistors and an absolute temperature. Thus, there is the disadvantage that variations in manufacturing semiconductor integrated circuits cause variations in capacity, resistance value and ambient temperature to change their characteristics.

SUMMARY OF THE INVENTION

An active filter circuit according to the present invention comprises a voltage current converting circuit having a variable gain and having a positive input end, a negative input end and an output end a first input terminal connected to the positive input end: a buffer circuit having an input end connected to the output end of the voltage-current converting circuit, and an output end; a first capacitor having a first end connected to the input end of the buffer circuit and a second end, and having a first capacity; a second input terminal connected to the second end of the first capacitor; and an output terminal connected in common to the output end of the buffer circuit and the negative input end of the voltage-current converting circuit; the voltage current converting circuit including a first current source with two output ends leading first and second currents, a second current source producing a third current, and a pair of first internal resistors having a first resistance value; the first and second current sources and the pair of first internal resistors being connected with one other so that the variable gain is in inverse proportion to the sum of the first resistance value and a first variation amount in proportion to a quotient of an absolute temperature converted ambient temperature of the voltage-current converting circuit divided by a value of the third current, in proportion to a value of the first current, and in inverse proportion to the sum of values of the first and second currents; the first current source including a first compensating current source circuit; and a second compensating current source circuit; the first compensating current source circuit including a second capacitor with a second capacity to produce a first compensating current in proportion to the second capacity; the second compensating current source circuit including a second internal resistor with a second resistance value to produce a second compensating current in inverse proportion to the second resistance value: the first current being in proportion to the first compensating current; the second current being in proportion to a difference between a current in proportion to the first compensating current and a current in proportion to the second compensating current; and the second current source including a third internal resistor with a third resistance value to produce a third current which is in proportion to the inverse number of the third resistance value and in proportion to the ambient temperature converted into an absolute temperature.

Preferably, the voltage-current converting circuit further includes first and second potential points; an active load; a differential amplifier connected to the active load; and first and second current drive transistors; the active load including first and second transistors and a fourth current source: the first transistor having a control electrode connected to a first one of said output ends to lead the first current in the first current source, a first current electrode connected to the first potential point and a second current electrode; the second transistor having a control electrode connected to a second one of said output ends to lead the second current in the first current source, a first current electrode connected through the fourth current source to the first potential point and connected to the output end of the voltage-current converting circuit, and a second current electrode; the fourth current source producing a dc component of the current led by the second current electrode in the second transistor; the differential amplifier including third and fourth transistors; he third transistor having a control electrode connected to the positive input end, a first current electrode connected to the first potential point, and a second current electrode connected through a first one of the first internal resistors to a first end of terminals of the second current source the fourth transistor having a control electrode connected to the negative input end, a first current electrode connected in common to the second current electrodes of the first and second transistors, and a second current electrode connected through a second one of the first internal resistors to the first end of the second current source; the first current drive transistor having a control electrode and a first current electrode connected with each other, and a second current electrode connected to the first output end of the first current source to lead the first current; the second current drive transistor having a control electrode and a first current electrode connected with each other, and a second current electrode connected to the second output end of the first current source to lead the first current; the second current source having a second end connected to the second potential point.

Preferably, the buffer circuit further includes a fifth transistor, a fifth current source, third and fourth potential points: the fifth transistor having a control electrode connected to an input end of the buffer circuit, a first current electrode connected to the third potential point, and a second current electrode connected to an output end of the buffer circuit; the fifth current source including a first end connected to the second current electrode in the fifth transistor, and a second end connected to the fourth potential point.

Preferably, the second potential point is the ground.

Preferably, the second input terminal is connected to the second potential point.

Preferably, the first input terminal is connected to the second potential point.

Preferably, the first and second input terminals receive signals which are complementary with each other.

Preferably, the active filter circuit further comprises a second voltage-current converting circuit which has a second variable gain and includes a positive input end connected to the output end of the buffer circuit, a negative input end connected to the output terminal, and an output end; a second buffer circuit including an input end connected to the output end of the second voltage-current converting circuit, and an output end connected to the output terminal; a third capacitor having a first end connected to the input end of the second buffer circuit and a second end, and having a third capacity; and a third input terminal connected t the second end of the third capacitor.

Preferably, the second potential point is the ground.

Preferably, the second and third input terminals are connected in common to the second potential point.

Preferably, the first and second input terminals are connected commonly to the second potential point.

Preferably, the first and third input terminals are connected commonly to the second potential point.

Preferably, the first and third input terminals are connected to each other, and the first and second input terminals receive signals which are complementary with each other.

Preferably, the first current source further includes first and second current mirror circuits and a current branch, the first current mirror circuit including a first branch for leading a current equivalent to the first compensating current, a second branch for leading a current in proportion to the current led along the first branch, and a third branch connected to the current branch; the current branch leading a current in proportion to the second compensating current; the second mirror current circuit including a first branch connected to the second branch of the first current mirror circuit, and a second branch for leading a current in proportion to the current led along the first branch of the second current mirror circuit.

Preferably, either of the second and third branches of the first current mirror circuit leads a current equivalent to the current led along the first branch of the first current mirror circuit.

Preferably, the second branch of the second current mirror circuit leads a current equivalent to the current led by the first branch of the second current mirror circuit.

Preferably, the current branch is connected to the first compensating current source circuit.

Preferably, the first current source further includes third and fourth current mirror circuits; the third current mirror circuit including a first branch for leading a current equivalent to the second compensating current and a second branch for leading a current equivalent to the current led along the first branch; the fourth current mirror circuit including a first branch connected to the second branch of the third current mirror circuit, and a second branch for leading a current in proportion to the current led along the first branch of the fourth current mirror circuit the second branch of the fourth current mirror circuit is equivalent to the current branch.

Preferably, the second branch of the third current mirror circuit leads a current equivalent to the current led along the first branch of the third current mirror circuit.

Preferably, the third branch of the second current mirror circuit is connected to the second branch of the fourth current mirror circuit.

Preferably, the fourth current mirror circuit further includes a first external resistor for leading a current equivalent to the current led along the first branch of the fourth current mirror circuit; and a second external resistor for leading a current equivalent to the current led along the second branch of the fourth current mirror circuit; the ratio of resistance values of the first and second external resistors determining the current led along the second branch.

Preferably, the first current source includes first, second, third and fourth current mirror circuits; the first current mirror circuit including a first branch for leading a current equivalent to the first compensating current, and a second branch for leading a current in proportion to the current led along the first branch; the second current mirror circuit including a first branch connected to the second branch of the first current mirror circuit, and a second branch for leading a current in proportion to the current led along the first branch of the second current mirror circuit; the third current mirror circuit including a first branch connected to the second branch of the second current mirror circuit, and second and third branches for leading a current in proportion to the current led along the first branch of the third current mirror circuit; the fourth current mirror circuit including a first branch connected to the second branch of the third current mirror circuit, and a second branch for leading a current in proportion to the current led along the first branch of the fourth current mirror circuit; the third branch of the third current mirror circuit being connected to the first compensating current source circuit.

Preferably, the second branch of the first current mirror circuit leads a current equivalent to the current led along the first branch of the first current mirror circuit.

Preferably, either of the second and third branches of the third current mirror circuit leads a current equivalent to the current led along the first branch of the third current mirror circuit.

Preferably, the second branch of the fourth current mirror circuit leads a current equivalent to the current led along the first branch of the fourth current mirror circuit.

Preferably, the second current mirror circuit further includes a first external resistor for leading a current equivalent to the current led along the first branch; and a second external resistor for leading a current equivalent to the current led along the second branch of the fourth current mirror circuit; the ratio of resistance values of the first and second external resistors determines the current led along the second branch.

Preferably, the second current mirror circuit further includes a plurality of output transistors and a plurality of switches; the switches having their respective first terminals connected in common to the first potential point, and respective second terminals connected in common to the second branch of the second current mirror circuit; the output transistors having their respective first current electrodes connected to respective common terminals of the switches, respective second current electrodes connected in common to the second external resistor, and respective control electrodes connected together.

Preferably, the plurality of output transistors are three transistors which are sized to the rate 1, 2 and 4, respectively.

Preferably, the first compensating current source circuit further includes first and second pulse input terminals, a voltage comparator, a phase comparator, an input transistor, a fixed potential point, and a third current mirror circuit; the voltage comparator having a positive input end, a negative input end and an output end; the input transistor having a control electrode connected to the second pulse input terminal, a first current electrode connected to a first end of the second capacitor and the fixed potential point, and a second current electrode connected in common to a second end of the second capacitor and the positive input end of the voltage comparator; a bias potential being applied to the negative input terminal of the voltage comparator; the phase comparator having the first input end connected to the first pulse input terminal and the second input end connected to the output end of the voltage comparator; the third current mirror circuit having first and second branches connected to the positive input end of the voltage comparator and the output end of the phase comparator, respectively; the first and third branches of the third current mirror circuit lead a current in proportion to the current led along the second branch of the third current mirror circuit; the phase comparator causing current to flow in the output end of the phase comparator so that pulses applied to the first and second input terminals of the phase comparator is equal in width.

Preferably, the second compensating current source circuit further includes a reference transistor, an output transistor, a reference current source and a reference voltage source; the reference transistor having first current electrode and control electrode connected to each other, and a second current electrode to which the reference voltage source is connected; the reference current source being connected to the first current electrode of the reference transistor; the output transistor having a control electrode connected to the first current electrode of the reference transistor, a first current electrode for leading a current almost equivalent to the current led in the third internal resistor, and a second current electrode connected to the third internal resistor.

Preferably, the second current source further includes first and second current mirror circuits; the first current mirror circuit including a first output transistor, a first branch for leading a current led by the first output transistor, and a second branch for leading a current in proportion to the current led along the first branch of the first current mirror circuit; the second current mirror circuit including a second output transistor, a first branch connected to the first branch of the first current mirror circuit for leading a current led by the second output transistor, and second and third branches for leading a current in proportion to the current led along the first branch of the second current mirror circuit; the second output transistor including a first current electrode connected to the first branch of the first current mirror circuit, and a second current electrode grounded through the third internal resistor the second branch of the second current mirror circuit being connected to the second branch of the first current mirror circuit.

According to the present invention, the second current source in the present invention includes a third internal resistor $R_0$ and produces a third current $2I_3$, retaining the relation as follows:

$$I_3 \propto \frac{1}{R_0} \times \frac{kT}{q} \quad (10)$$

where T is an ambient temperature T converted into an absolute temperature.

Also, the first current source in the present invention has a second internal resistor of resistance value $R_a$ in the second compensating current source circuit, and the second capacitor of capacity $C_0$ in the first compensating current source circuit, and it produces a current $I_A$ expressed as follows, $$I_A \propto C_0 \quad (11)$$

and also produces a current $I_A$ under the relation as follows:

$$(I_A + I_D) \propto \frac{1}{R_a} \quad (12)$$

By virtue of producing these currents, a frequency characteristics of the active filter circuit is determined by the ratio of resistance values of the first, second and third internal resistors and the ratio of the first and second capacitors but not depends upon their absolute values. Also it does not depend upon an ambient temperature.

Especially in the first current source, when the first and second currents are set, a current in proportion to the first or second compensating current is used to set its proportional coefficient in accordance with the ratio of the first and second external resistors, and therefore, a frequency characteristics of the active filter circuit can be arbitrarily set from the outside, and dependency upon variations in manufacturing semiconductor integrated circuits and dependency upon an ambient temperature of it can be regulated again.

Moreover, connecting or disconnecting the plurality of output transistors to the first compensating current source circuit by the plurality of switches, a measure of the first current can be set.

Accordingly, it is an object of the present invention to provide an active filter circuit having a characteristics which does not depend upon variations of passive elements caused by variations in manufacturing the circuit and upon a temperature dependency.

These and other object, features, aspect and advantages of the present invention will become more apparent from the following detailed description of the present invention when taken in conjunction with the accompanying drawings.

DESCRIPTION OF THE PREFERRED EMBODIMENT

A) Theory of the Present Invention

Before explaining specific embodiments, the theory of the present invention will be explained.

Figure 10:
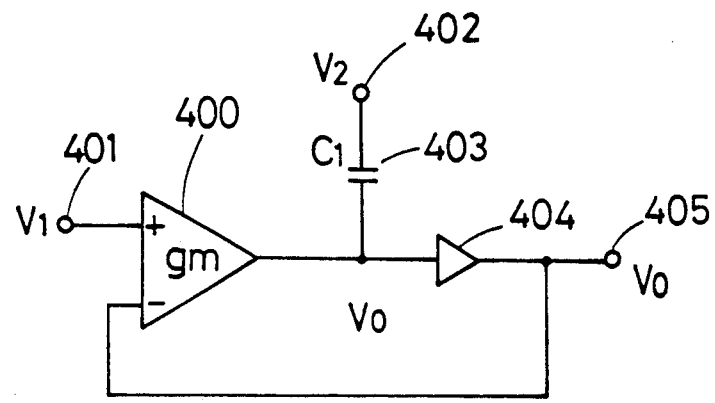
FIG. 10 is a circuit diagram for explaining the theory of the present invention.

In general, a primary active filter circuit can be depicted as shown in FIG. 10. Specifically, a converting circuit 400 which has a variable gain $g_m$ and performs voltage-current conversion has its positive input end connected to a first input terminal 401 and its negative input end connected to an output terminal 405. Also, it has an output end connected in common to an input end of a buffer 404 and a first end of a capacitor 403. The buffer 404 has its output end connected to the output terminal 405 while the capacitor 403 has its second end connected to a second input terminal 402. Input voltages $V_1$ and $V_2$ are applied to the first and second input terminals 401, 402, respectively.

Assuming that a capacity of the capacitor 403 is $C_1$, an output potention $V_0$ appearing at the output terminal 405 of this active filter circuit can be expressed as follows:

$$V_0 = \frac{j\omega V_2 + ZV_1}{j\omega + Z} \quad (13)$$

However, there must be the following relation:

$$Z = g_m/C_1 \quad (14)$$

Figure 12:
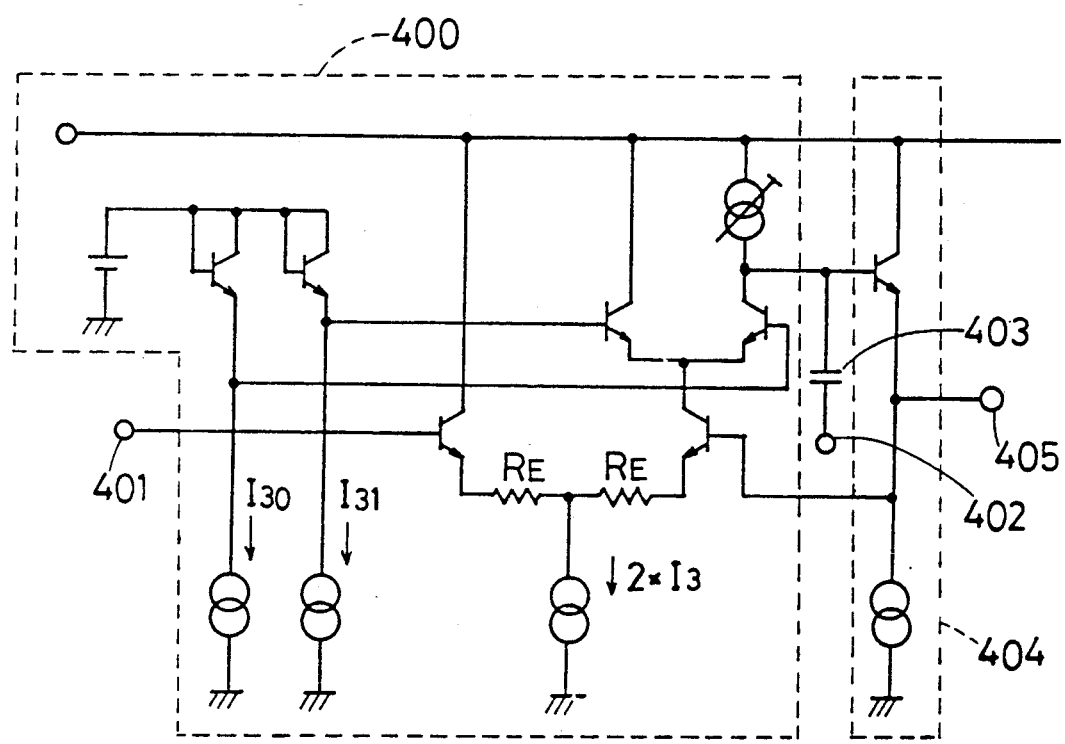
FIG. 12 is a circuit diagram for explaining another embodiment according to the present invention.
Figure 13:
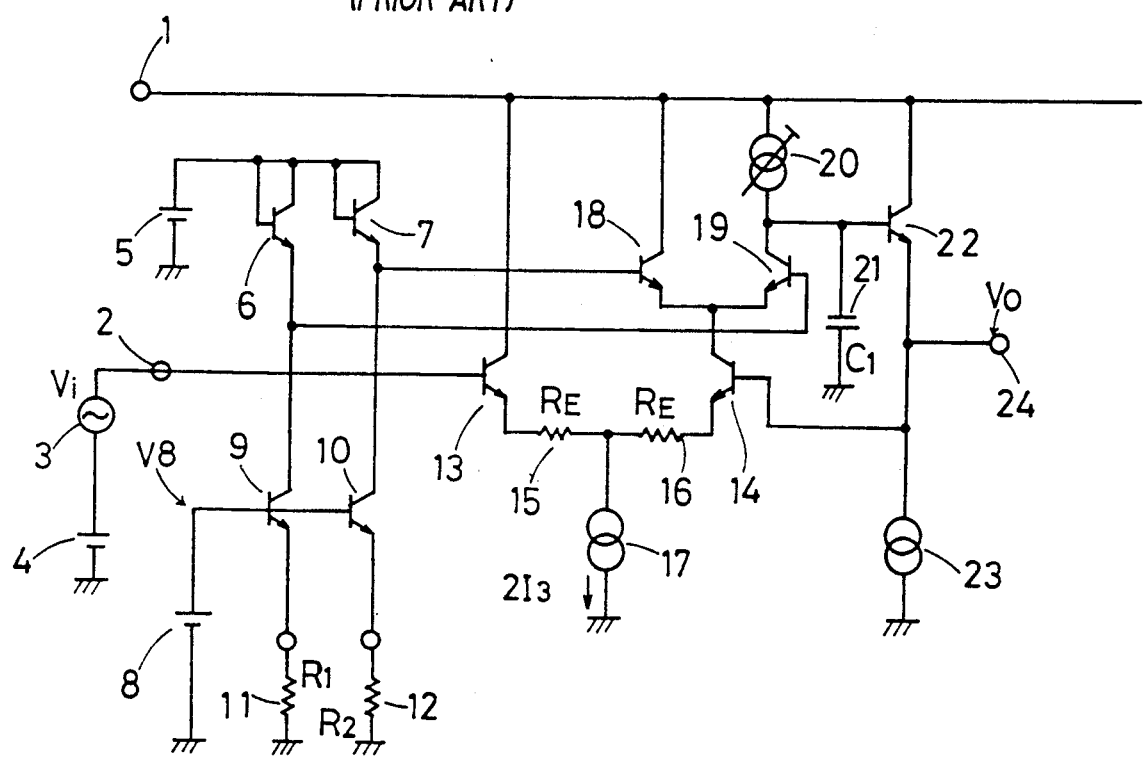
FIG. 13 is a circuit diagram showing a structure of a conventional active filter circuit.

The converting circuit 400 may be configured as a circuit as shown in FIG. 12, for example, and hence, according to the theory similar to that for the formula 7, the variable gain $g_m$ can be obtained by the following formula:

$$g_m = \frac{1}{2\left(R_E + \frac{kT/q}{I_3}\right)} \times \frac{I_{31}}{I_{30} + I_{31}} \quad (15)$$

Now, a case where a current source which generates a current to $2I_3$ incorporates a resistor having resistance value $R_0$ and another current source which generates currents $I_{30}$ and $I_{31}$ incorporates a capacitor having capacitive value $C_0$ and a resistor having resistance value $R_a$ will be described. Assuming that "a", "b" and "d" are constants, if the following equations, $$I_3 = a \cdot \frac{1}{R_0} \cdot \frac{kT}{q}, \; I_{31} = b \cdot C_0, \; I_{30} + I_{31} = d \cdot \frac{1}{R_a} \quad (16)$$

can be established, the formula 14 can be varied as follows:

$$Z = \frac{g_m}{C_1} = \frac{1}{2C_1\left(R_E + \frac{R_0}{a}\right)} \times \frac{b \cdot C_0 \cdot R_a}{d} \quad (17)$$

In this formula, since the capacities $C_0$ and $C_1$ of the internal capacitors lie in the numerator and denominator, respectively, the value Z is determined by the ratio of the capacitive values without depending upon the absolute values of them. Furthermore, since the resistance values $R_0$ and $R_E$ lie in the denominator while the resistance value $R_a$ lies in the numerator, the value Z is determined by the ratio of the resistance values without depending upon the absolute values of them. Moreover, an absolute temperature T is cancelled and the value Z is never affected by it. Thus, as ill be recognized in the formula 13, the characteristics of the active filter circuit is determined by the ratio of he capacitive values and the ratio of the resistance values but never depend upon the value of the absolute temperature T.

Generally, in a semiconductor integrated circuit, though the absolute accuracy of capacities and resistance values vary widely, the variations of the ratio of the capacities and the ratio of the resistance values can be restrained within ± several %. Accordingly, the characteristic of the active filter circuit is not so affected by the variations in manufacturing. The ambient temperature T expressed by the absolute temperature is cancelled, and therefore, there is no dependency upon the ambient temperature.

B) Specific Embodiments

Now, cases in which the present invention is applied to specific active filter circuits and specific circuit structures to implement the formula 16 will be described in conjunction with the accompanying drawings.

(B 1) First Embodiment

First, a first preferred embodiment in which the present invention is applied to a primary lowpass filter circuit will be described with reference to FIG. 1.

Figure 1:
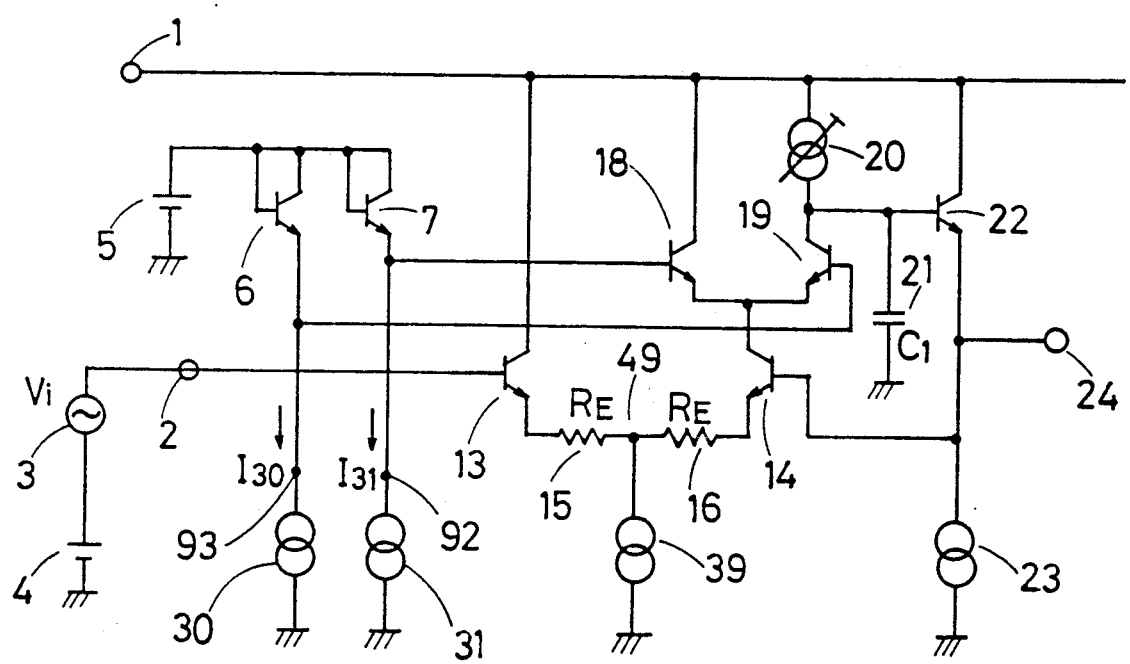
FIG. 1 is a circuit diagram showing a structure of an active filter circuit of an embodiment according to the present invention.

Referring to FIG. 1, an input terminal 2 is connected to a base of an NPN transistor 13. The input terminal 2 receives a signal which is do bias voltage applied by a voltage source 4 superposed with an ac signal $V_i$ applied by an ac signal source 3.

An NPN transistor 13 has its collector connected to a power source 1 and its emitter connected through a resistor 15 (resistance value $R_E$) to a terminal 49 and a first end of a constant current source 39. A second end of the constant current source 39 is grounded. The constant current source 39 generates dc current $2I_3$.

The constant current source 39 has its first end connected to a first end of a resistor 16 (resistance value $R_E$) while the resistor 16 has its second end connected to an emitter of an NFN transistor 14. The NPN transistor 14 has its base connected to an output terminal 24 and its collector connected to emitters of NPN transistors 18 and 19. The NPN transistor 18 has its collector connected to the power source 1 and its base connected to an emitter of an NPN transistor 7 The NPN transistor 19 has its collector connected to a first terminal of a constant current source 20 while the constant current source 20 has its second end connected to the power source 1. The collector of the NPN transistor 19 is also connected to a base of an NPN transistor 22 and a first end of a capacitor 21 (capacity $C_1$). The capacitor 21 has its second end grounded.

An NPN transistor 22 has its collector connected to the power source 1 and its emitter connected to the output terminal 24 and a first end of a constant current source 23. The constant current source 23 has its second and grounded. The NPN transistor 19 has its base connected to an emitter of an NFN transistor 6 while transistors 6 and 7 have their respective bases and collectors connected in common to a voltage source 5. The emitter of the NPN transistor 6 is connected through a terminal 93 to a first end of a current source 30 while the current source 30 has its second end grounded. The emitter of the NPN transistor 7 is connected through a terminal 92 to a first end of a current source 31, while the current source 31 has its second end grounded. The current sources 30 and 31 generate dc currents $I_{30}$ and $I_{31}$ to the transistors 6 and 7, respectively. In such an active filter circuit according to the theory similar to that for the formula 7, the following relation is established between an ac signal $V_o$ which is an output of the active filter circuit and an input signal $V_i$:

$$V_o = \frac{Z}{j\omega + Z} \times V_i \quad (18)$$

In this case, however, there must be the following relation:

$$Z = \frac{1}{2} \times \frac{1}{C_1} \times \frac{1}{R_E + \frac{kT/q}{I_3}} \times \frac{I_{31}}{I_{30} + I_{31}} \quad (19)$$

This corresponds to the case in which the potential $V_2$ is zero in the formula 13.

If the dc currents $I_{30}$, $I_{31}$ and $I_3$ satisfy the relations expressed in the equations 16, the following formula can be obtained according to the formula 19:

$$Z = \frac{1}{2} \times \frac{1}{C_1} \times \frac{1}{R_E + \frac{kT}{q} \cdot \frac{1}{a} \cdot R_0 \cdot \frac{q}{kT}} \times \frac{b \cdot C_0}{d \cdot \frac{1}{R_a}} \quad (20)$$

$$= \frac{1}{2} \times \frac{1}{C_1} \times \frac{1}{R_E + \frac{R_0}{a}} \times \frac{b \cdot C_0 \cdot R_a}{d}$$

In this formula, since the capacities $C_0$ and $C_1$ of the internal capacitor lie in the numerator and denominator, respectively, the value Z is determined by the ratio of the capacitive values without depending upon the absolute values of them. Furthermore, since the resistance values $R_0$ and $R_E$ lie in the denominator by the resistance value $R_a$ lies in the numerator, the value Z is determined by the ratio of the resistance values without depending upon the absolute values of them. Moreover, an absolute temperature T is cancelled and the value Z is never affected by it. Thus, as will be recognized in the formula 18, the characteristics of the active filter circuit is determined by the ratio of the capacitive values and the ratio of the resistance values but never depend upon the value of the absolute temperature T.

(B-2) Configuration of the Current Source 39

Now the circuit to implement a current source for producing the direct current $I_3$ which satisfies the formula 16 will be described.

Figure 2:
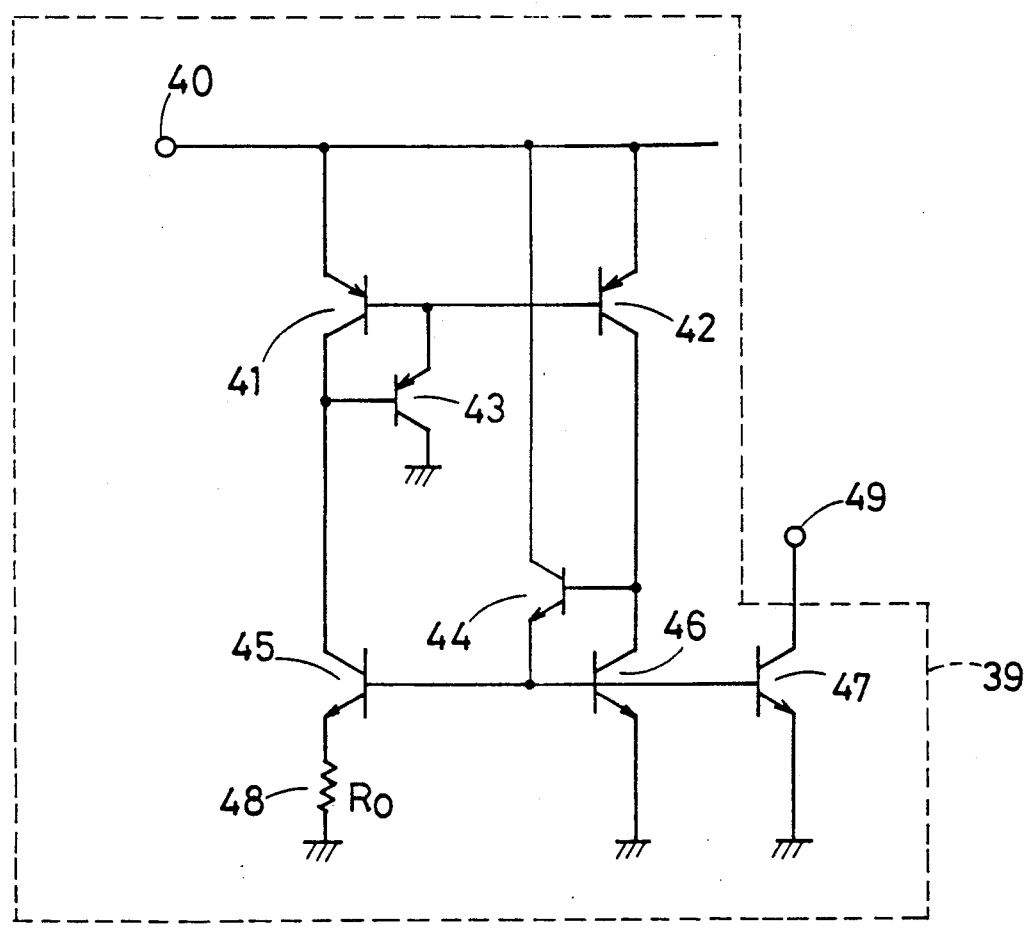
FIG. 2 is a circuit diagram showing a structure of a current source in proportion to $kT/(qR_0)$.

FIG. 2 shows an inner structure of the current source 39 which is in proportion to an inverse number $(1/R_0)$ of the resistance value $R_0$ of an internal resistor 48 and an absolute temperature T.

A PNP transistor 41 has its emitter connected to a power source terminal 40 and its base connected to a base of a PNP transistor 42. The PNP transistor 42 has its emitter connected to the power source terminal 40 and its collector connected to a collector of an NPN transistor 46. The PNP transistor 41 has its collector connected to a collector of an NPN transistor 45, which, in turn, has its emitter grounded through the resistor 48 and its base connected in common to bases of NPN transistors 46 and 47. The NPN transistors 46 and 47 have their respective emitters grounded, and the transistor 47 has its collector connected to a terminal 49.

The PNP transistor 41 has its base and collector connected to an emitter and base of the PNP transistor 43, respectively. The PNP transistor 43 has its collector grounded. The NPN transistor 46 has its base and collector connected to an emitter and base of an NPN transistor 44, respectively. The NPN transistor 44 has its collector connected to the power source terminal 40 and its base connected to the collector of the NPN transistor 46.

Then, the operation of this circuit will be described. Assuming that the transistor 41 is 1 in transistor size while the transistor 42 is F in transistor size, emitter currents $I_{41E}$ and $I_{42E}$ of the transistors 41 and 42, respectively, can be expressed as follows:

$$I_{41E} = i_{01} \exp\left[\frac{qV_{BE41}}{kT}\right] \quad (21)$$

$$I_{42E} = F \times i_{01} \exp\left[\frac{qV_{BE42}}{kT}\right]$$

where $i_{01}$ is a reverse direction saturation current of the transistor 41, and $V_{BE41}$ and $V_{BE42}$ are base emitter voltages of the transistors 41 and 42, respectively.

Since $V_{BE41} = V_{BE42}$, the formula 21 must be as follows:

$$I_{41E}/I_{42E} = 1/F \quad (22)$$

Assuming that the transistor 46 is 1 in transistor size, the transistor 45 is G in transistor size, and the resistor 48 is $R_0$ in resistance value, emitter currents $I_{45E}$ and $I_{46E}$ of the transistors 45 and 46, respectively, become as follows:

$$I_{46E} = i_{02} \exp\left[\frac{qV_{BE46}}{kT}\right] \quad (23)$$

$$I_{45E} = G \times i_{02} \exp\left[\frac{q(V_{BE46} - R_0 I_{45E})}{kT}\right]$$

where $i_{02}$ is a reverse direction saturation current of the transistor 46, and $V_{BE46}$ is a base emitter voltage of the transistor 46. According to the formula 23, the following formula can be obtained:

$$I_{46E}/I_{45E} = \frac{1}{G} \times \exp\left[\frac{qR_0 I_{46E}}{kT}\right] \quad (24)$$

and also, since equations $$I_{41E} = I_{45E}, \quad I_{42E} = I_{46E} \quad (25)$$

are satisfied, the formula 24 varies as follows:

$$I_{46E}/I_{45E} = I_{42E}/I_{41E} \tag{26}$$
$$= F$$
$$= \frac{1}{G} \times \exp\left[\frac{qR_0 I_{46E}}{kT}\right]$$

Therefore, the relation expressed as $$I_{46E} = \frac{1}{R_0} \times \frac{kT}{q} \ln(G \times F) \tag{27}$$

can be obtained. Assuming now that there is the relation $$2a = \ln(G \times F) \tag{28}$$

the formula 27 varies as follows:

$$I_{46E} = 2a \cdot \frac{1}{R_0} \cdot \frac{kT}{q} \tag{29}$$

Assuming that the rate of transistor sizes of the transistor 46 to the transistor 47 is 1:1, output current $I_{49}$ produced at a first terminal 49 of the current source 39 is as follows;

$$I_{49} = 2a \cdot \frac{1}{R_0} \cdot \frac{kT}{q} \tag{30}$$

and thus, the formula 16 is satisfied. In other words, at the terminal 49 in FIG. 1, the current can be applied that is in proportion to a reverse number of the resistance value $R_0$ of an internal resistor 48 and in proportion to an ambient temperature T expressed by an absolute temperature.

(B-3) Structures of the Current Sources 30 and 31

Figure 3:
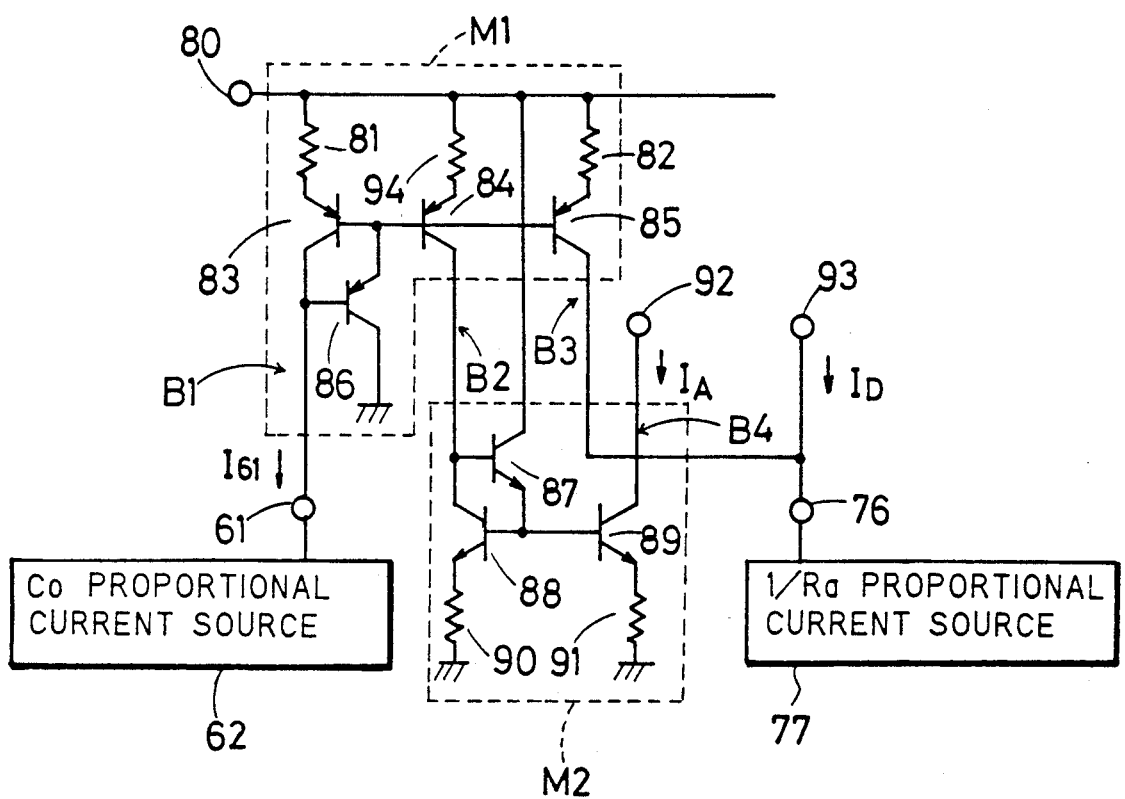
FIG. 3 is a circuit diagram showing a structure of current sources 30 and 31.

FIG. 3 shows a circuit of a current source, such as current sources which produce dc currents $I_{30}$ and $I_{31}$ having the relations expressed in the formula 16. The current sources 30 and 31 shown in FIG. 1 can be implemented by this circuit, and dc currents $I_A$ and $I_D$ are applied to terminals 92 and 93, respectively. Thus, in FIG. 1, the currents $I_A$ and $I_D$ obtained by this circuit can be used as the currents $I_{31}$ and $I_{30}$, respectively.

A $C_0$ proportional current source 62 has an internal capacitor within it to produce a current $I_{61}$ in proportion to its capacity $C_0$. The structure of the $C_0$ proportional current source 62 will be described later.

The $C_0$ proportional current source 62 is connected through a terminal 61 to a reference branch B1 in a current mirror circuit M1. The current mirror circuit M1 has two branches B2 and B3 which lead a current equivalent to the current led along the reference branch B1. A current mirror circuit M2 is connected through the branch B2 to the current mirror circuit M1. The current mirror circuit M2 has the branch B2 as a reference branch and has a branch B4 which leads a current equivalent to the current led along the reference branch. The branch B4 is connected to a terminal 2.

On the other hand, a branch B3 is connected through a terminal 76 to a $1/R_a$ proportional current source 77 and further connected to a terminal 93. The $1/R_a$ proportional current source 77 has an internal resistor within it to produce current $I_{76}$ in proportion to a reverse number of its resistance value $R_a$. The structure of the $1/R_a$ proportional current source 77 will also be described later.

The current mirror circuit M1 is configured as mentioned below in FIG. 3. A PNP transistor 83 has its collector connected through the branch B1 to a terminal 61, its emitter connected through a resistor 81 to a power source terminal 80, and its base connected commonly to respective bases of PNP transistors 84 and 85.

The transistor 84 has its emitter connected through a resistor 94 to the power source terminal 80 and its collector connected through the branch B2 to the current mirror circuit M2. The transistor 85 has its emitter connected through a resistor 82 to the power source terminal 80 and its collector connected through the branch B3 to a terminal 93. A PNP transistor 86 has its collector grounded, and its base and emitter connected to a collector and a base of the transistor 83, respectively.

The current mirror circuit M2 is configured as mentioned below in FIG. 3. An NPN transistor 88 has its collector connected through the branch B2 to the current mirror circuit M1, its base connected to a base of an NPN transistor 89 and its emitter grounded through a resistor 90.

The NPN transistor 89 has its collector connected through the branch B4 to a terminal 92 and its emitter grounded through a resistor 91. A transistor 87 has its collector connected to the power source terminal 80 and its base and emitter connected to a collector and a base of the transistor 88, respectively.

Then, the operation of the circuit will be described. The $C_0$ proportional current source 62 and $1/R_a$ proportional current source 77 have structures as mentioned above, so that currents $I_{61}$ and $I_{76}$ as expressed by the following formula can be applied to the terminals 61 and 76, receptively:

$$I_{61} = b \cdot C_0 \tag{31}$$

$$I_{76} = d \cdot \frac{1}{R_a} \tag{31}$$

First, assuming that the resistance values of the resistors 81, 94 and 82 are all equal in the current mirror circuit M1 and that the transistors 83, 84 and 85 are equal in transistor size, the collector currents $I_{84C}$ and $I_{85C}$ of the transistors 84 and 85 (the currents led along the branches B2 and B3), respectively, can be expressed as follows:

$$I_{84C} = I_{85C} = I_{61} \tag{32}$$

Then, assuming that the resistance values of the resistors 90 and 91 are equal in the current mirror circuit M2 and that the transistors 88 and 89 are equal in transistor size, the collector current $I_{89C}$ of the transistor 89 has the relation of the following formula according to the formulae 31 and 32:

$$I_{89C} = I_{84C} = I_{61} = b \cdot C_0 \tag{33}$$

Hence, the current $I_A$ output to the terminal 92 (the current lead along the branch B4) becomes as follows;

$$I_A = b \cdot C_0 \tag{34}$$

and now if $I_A = I_{31}$, the formula 16 is satisfied. Thus, the current $I_D$ output to a terminal 93, according to the formulae 31 and 32, becomes as follows;

$$I_D = I_{76} - I_{85C} \quad (35)$$
$$= d \cdot \frac{1}{R_a} - b \cdot C_0$$

and now if $I_D = I_{30}$, the formula 16 is satisfied.

(B-4) Structure of the $C_0$ Proportional Current Source 62

Then, a specific structure to implement the $C_0$ proportional current source 62 will be explained.

Figure 4:
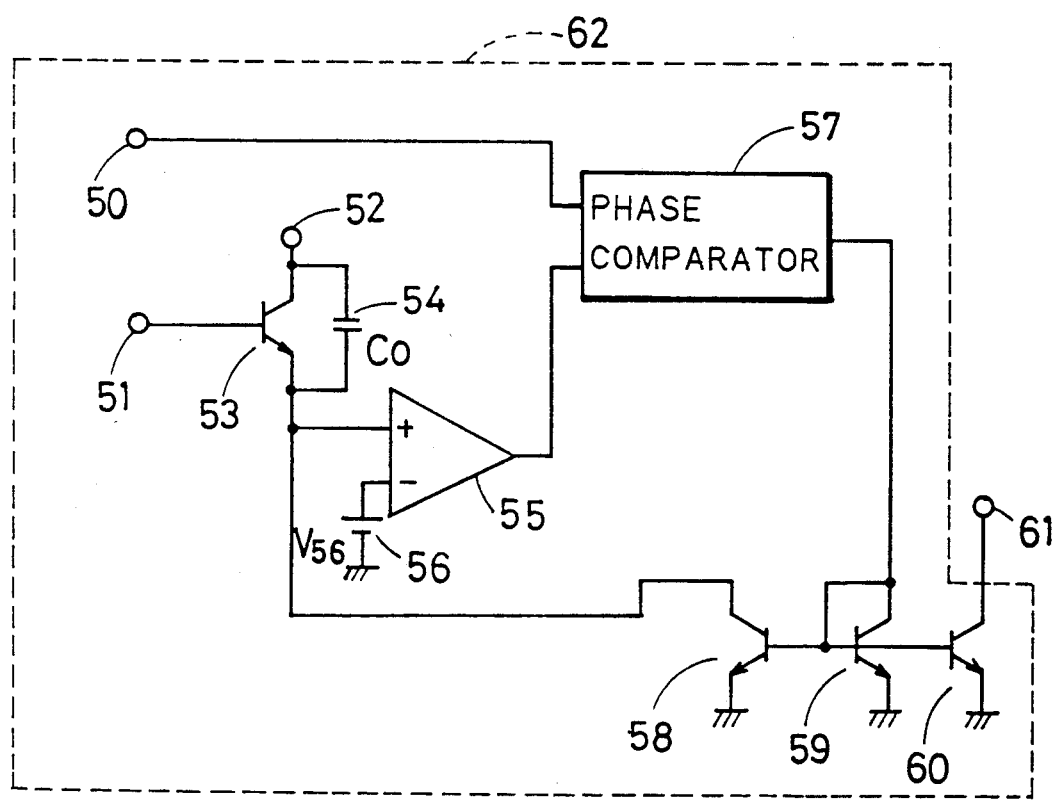
FIG. 4 is a circuit diagram showing a structure of a $C_0$-proportional current source.

FIG. 4 is a block diagram showing a structure of the $C_0$ proportional current source 62. An NPN transistor 53 has its base connected to an input terminal 51, its collector connected to a power source terminal 52 and its emitter connected to a positive input end of a comparator 55 together with collector of an NFN transistor 58. An internal capacitor 54 having a capacity $C_0$ is connected between a collector and an emitter of the NPN transistor 53.

The comparator 55 has its negative input end connected to a voltage source 56 and its output end connected to a first input end of a phase comparator 57. The phase comparator 57 has its second input end connected to an input terminal 50 and its output end connected to a collector of an NPN transistor 59.

The transistor 59 has its base and collector short-circuited and its emitter grounded. Also, the base of the transistor 59 is connected commonly to respective bases of NPN transistors 58 and 60. The transistors 58 and 60 have their respective emitter grounded and the transistor 60 has its collector connected to the terminal 61.

Figure 5:
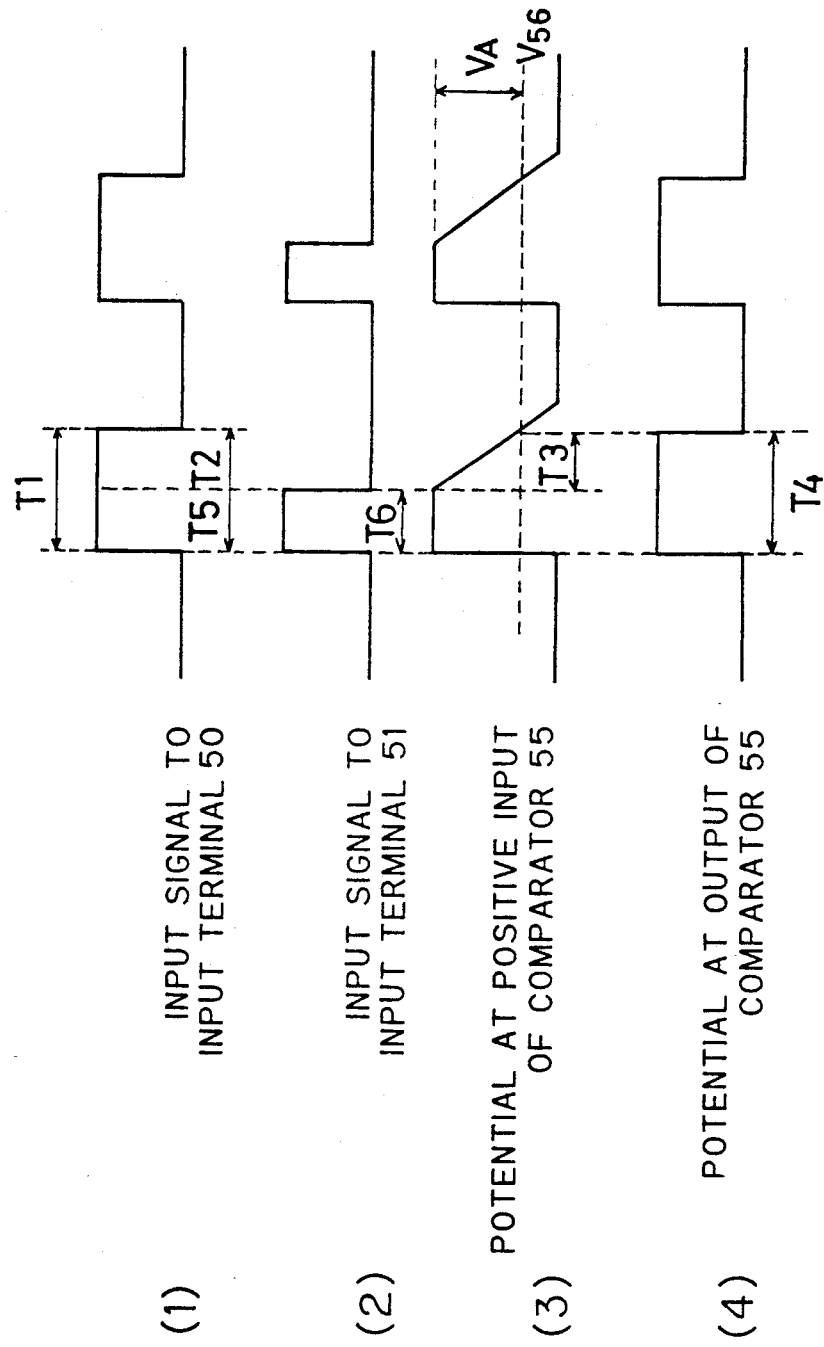
FIG. 5 is a timing chart showing an operation of the $C_0$-proportion current source.

FIG. 5 is a timing chart showing a timing of signals input to the input terminals 50 and 51 in FIG. 4, and potentials at a positive input end and output end of the comparator 55.

When a signal of a waveform (2) of FIG. 5 is input to the input terminal 51 in FIG. 4, or to a base of the transistor 53, a potential at the positive input end of the comparator 55 is raised because of a potential at the power source terminal 52 during a period T6. However, after that the potential at the positive input of the comparator 55 falls in accordance with a time constant determined by a capacity $C_0$ of the internal capacitor 54 and the collector current of the transistor 58, and consequently, the potential at the positive input end of the comparator 55 has a waveform (3) with a tilt the period T6 after.

When the potential is higher than voltage $V_{56}$ of the voltage source 56, output end of the comparator 55 turns to "HIGH" while, when it is lower, it turns to "LOW", and consequently, a waveform (4) can be obtained that has a pulse width of a period T4 as a potential of the output end of the comparator 55. The phase comparator 57 receives at its second input end from an input terminal 50 a signal which has a pulse width T1 shown by a waveform (1) and rises simultaneously with the signal input to the input terminal 51, and its first input end from an output end of the comparator 55 a potential shown by the waveform (4). The phase comparator 57 uses the collector current of the transistor 58 to cause a feedback to the positive input end of the comparator 55 through the transistors 59 and 58 so that the periods T1 and T4 become the same.

In the waveform (3), when a voltage from its peak to the threshold value $V_{56}$ of the comparator is $V_A$, a period T3 assuming a value of the voltage $V_A$ or above the period T6 after can exhibit the relation as expressed as follows:

$$T3 = \frac{V_A \times C_0}{I_{58C}} \quad (36)$$

where $I_{58C}$ is the collector current of the transistor 58. In FIG. 5, the relations $$T1 = T5 + T2 = T6 + T3 = T4, T5 \approx T6 \quad (37)$$

are established, and therefore, there can be obtained an equation as follows:

$$T3 = T1 - T6 \quad (38)$$

where T1 nd T6 are pulse widths of signals input to the input terminals 50 and 51, and since they are input as logic waveforms, a value of (T1−T6) can be fixed. According to the formula 36, the formula $$T3 = \frac{V_A \times C_0}{I_{58C}} = T1 - T5, I_{58C} = \frac{V_A \times C_0}{T1 - T5} \quad (39)$$

can be obtained. The voltage $V_A$ also takes a fixed value, and thus, using a fixed value b, the following expression can be obtained:

$$I_{58C} = b \cdot C_0$$
$$b = \frac{V_A}{T1 - T5} \quad (40)$$

When the transistors 58, 59 and 60 are equal in transistor size, the collector current $I_{60C}$ of the transistor 60 is equal to the collector current $I_{58C}$ of the transistor 58. Thus, output current $I_{61}$ at the terminal 61 becomes as follows:

$$I_{61} = b \cdot C_0 \quad (41)$$

In this way, the $C_0$ proportional current source 62 can be configured which can produce a current in proportion to a capacity $C_0$ of the internal capacitor 54 to the terminal 61.

(B-5) Structure of the $1/R_a$ Proportional Current Source 77

Now, a specific structure to implement the $1/R_a$ proportional current source 77 will be explained.

Figure 6:
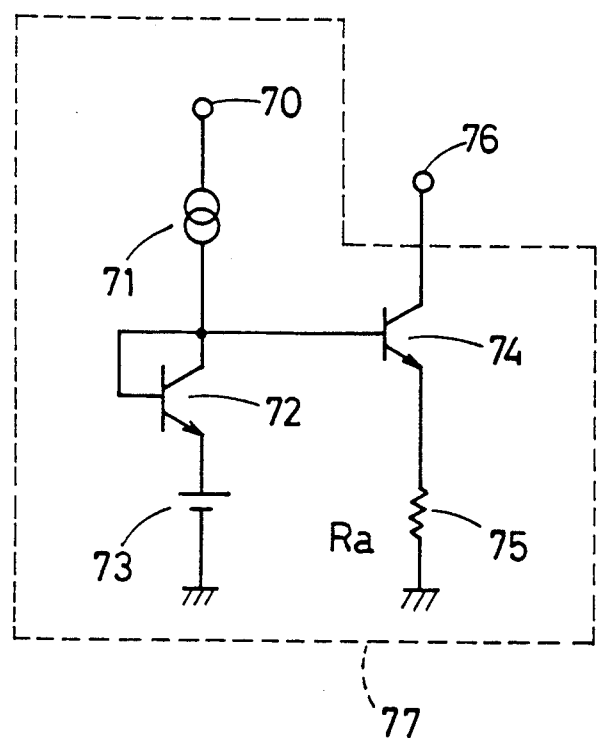
FIG. 6 is a circuit diagram showing a structure of a $1R_a$-proportional current source.

FIG. 6 is a circuit diagram showing a structure of the $1/R_a$ proportional current source 77. A transistor 72 has its base and collector short circuited and it is connected through a current source 71 to a power source terminal 70. The transistor 72 also has its emitter grounded through a voltage source 73. The transistor 72 has its base connected to a base of an NPN transistor 74 while the transistor 74 has its emitter grounded through an internal resistor 75 of a resistance value $R_a$ and its collector connected to an output terminal 76.

Assuming now that the voltage of the voltage source 73 is $V_{73}$ and that the transistors 72 and 74 are equal in transistor size, the emitter current $I_{74E}$ of the transistor 74 can be expressed as follows:

$$I_{74E} = V_{73}/R_a \quad (42)$$

Thus, now if $V_{73}=d$, the formula 42 can be varied as follows:

$$I_{74E} = d \cdot \frac{1}{R_a} \qquad (43)$$

Hence, the current $I_{76}$ of the output terminal 76 becomes as follows;

$$I_{76} = d \cdot \frac{1}{R_a} \qquad (44)$$

and it becomes a current in proportion to a reverse number of the internal resistor $R_a$.

(B-6) Other Structures of the Current Sources 30 and 31

The current sources 30 and 31 for producing the currents $I_A$ and $I_D$ can be configured in a way other than that which has been described in (B-3).

Figure 7:
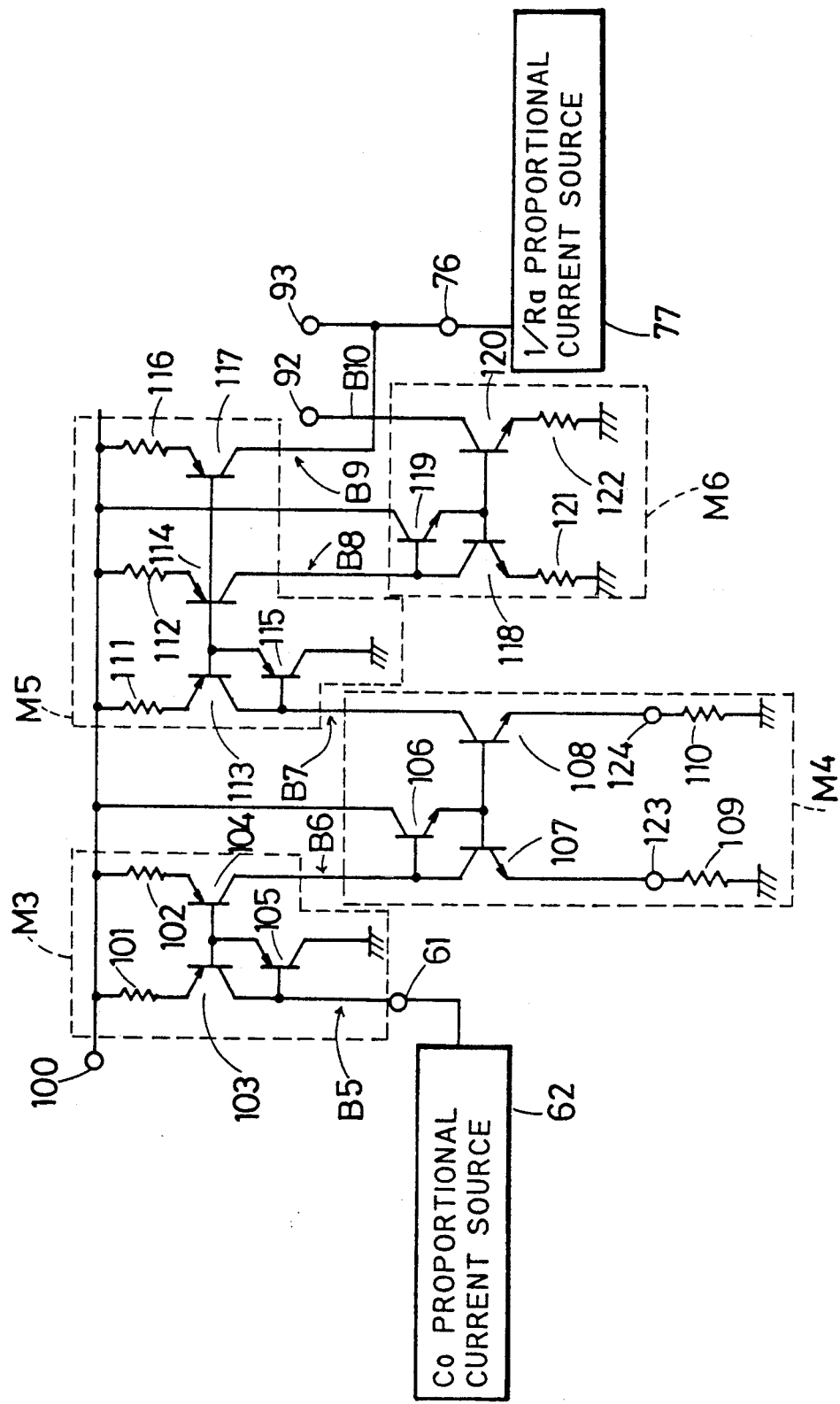
FIG. 7 is a circuit diagram showing a structure of the current sources 30 and 31.

FIG. 7 shows a block diagram of configurations of current sources for producing the currents $I_{30}$ and $I_{31}$ which satisfy the relation expressed in the formula 16.

The $C_0$ proportional current source 62 is connected through the terminal 61 to the reference branch B5 in &he current mirror circuit M3. The current mirror circuit M3 has a branch B6 which leads a current equivalent to the current led along the reference branch B5. A current mirror circuit M4 is connected through the branch B6 to the current mirror circuit M3. The current mirror circuit M4 has the branch B6 serving as a reference and a branch B7 which leads a current in proportion to the current led along &he reference branch B6.

The $1/R_a$ proportional current source 77 is connected through a terminal 76 and a branch B9 to a current mirror circuit M6. The current mirror circuit M6 is connected through a branch B8 to a current mirror circuit M5 and also connected through a branch B10 to a terminal 92. The current mirror circuit M5 is connected through the branch B7 to the current mirror circuit M4 and also connected through the branch B9 to a terminal 93.

Herein, the current mirror circuit M5 allows the branches B8 and B9 to lead a current equivalent to the current led along the branch B7. The current mirror circuit M6 allows the branch B10 to lead a current equivalent to the current led along the branch B8. Thus, the current mirror circuits M5 and M6 have the same connection relation to the $1/R_a$ proportional current source 77 as the current mirror circuits M1 and M2, respectively, shown in FIG. 3.

The current mirror circuit M3 can be configured as mentioned below in FIG. 7. A PNP transistor 103 has its collector connected through the branch B5 to the terminal 61, its emitter connected through a resistor 101 to a power source terminal 100, and its base connected to a base of a PNP transistor 104.

The transistor 104 has its emitter connected through a resistor 102 to the power source terminal 100 and its collector connected through the branch B6 to the current mirror circuit M4. A PNP transistor 105 has its collector grounded and its base and emitter connected to a collector and a base of a transistor 103, respectively.

The current mirror circuit M4 can be configured as mentioned below in FIG. 7. An NPN transistor 107 has its collector connected through the branch B6 to the current mirror circuit M3 and its base connected to a base of an NPN transistor 108. The transistors 107 and 108 have their respective emitters connected to terminals 123 and 124, which, in turn, are grounded through external resistors 109 and 110. The transistor 108 has its collector connected through the branch B7 to the current mirror circuit M5. The PNP transistor 106 has its collector connected to the power source terminal 100 and its base and emitter connected to a collector and a base of the transistor 107, respectively.

The current mirror circuit M5 can be configured as mentioned below in FIG. 7. A PNP transistor 113 has its collector connected through the branch B7 to the current mirror circuit M4, its emitter connected through a resistor 111 to the power source terminal 100, and its base connected commonly to respective bases of PNP transistors 114 and 117.

The transistor 114 has its emitter connected through a resistor 112 to the power source terminal 100 and its collector connected through the branch B8 to the current mirror circuit M6. The transistor 117 has its emitter connected through a resistor 116 to the power source terminal 100 and its collector connected through the branch B9 to the terminal 93. A PNP transistor 115 has its collector grounded and its base and emitter connected to a collector and a base of the transistor 113, respectively.

The current mirror circuit M6 can be configured as mentioned below in FIG. 7. An NPN transistor 118 has its collector connected through the branch B8 to the current mirror circuit M5, its base connected to a base of an NPN transistor 120 and its emitter grounded through a resistor 121.

The NPN transistor 120 has its collector connected through the branch B10 to the terminal 92 and its emitter grounded through a resistor 122. A transistor 119 has its collector connected to the power source terminal 100 and i&s base and emitter connected to a collector and a base of the transistor 118, respectively.

Now, the operation of the circuit will be described. Assuming that the resistors 101 and 102 are equal in resistance value and the transistors 103 and 104 are equal in transistor size in the current mirror circuit M3, the collector current $I_{104C}$ of the transistor 104 (the current led along the branch B6) can be expressed as follows:

$$I_{104C}=I_{61} \qquad (45)$$

Then, assuming that the transistors 107 and 108 are equal in transistor size and the resistors 109 and 110 take resistance values $R_{109}$ and $R_{110}$, different from each other in the current mirror circuit M4, the respective emitter currents $I_{107E}$ and $I_{108E}$ of the transistors 107 and 108 have the relations as expressed below:

$$I_{107E} \times R_{109} \approx I_{108E} \times R_{110} \qquad (46)$$

With regard to the branch B6, there is the following relation;

$$I_{107E} \approx I_{104C} \qquad (47)$$

and therefore, it can be found that the current $I_{108E}$ can be expressed as follows:

$$I_{108E} = \frac{R_{109}}{R_{110}} \times I_{104C} = \frac{R_{109}}{R_{110}} \cdot I_{61} \qquad (48)$$

Assuming that the transistors 113, 114 and 117 are all equal in transistor size and the resistors 111, 112 and 116 are equal in resistance value in the current mirror circuit M5, the respective collector currents $I_{114C}$ and $I_{117C}$ of the transistors 114 and 117 can be expressed as follows:

$$I_{114C} = I_{117C} = I_{108E} \quad (49)$$

Assuming that the transistors 118 and 120 are equal in transistor size and the resistors 121 and 122 are equal in resistance value in the current mirror circuit M6, the current $I_A$ output to the terminal 92 the current led along the branch B10) and the current $I_D$ output to the terminal 93, according to the formulae 41, 48 and 49, can be expressed as follows:

$$I_A = I_{114C} = \frac{R_{109}}{R_{110}} \cdot I_{61} = \frac{R_{109}}{R_{110}} \cdot b \cdot C_0, (50)$$

$$I_D = I_{76} - I_{117C}$$

$$= I_{76} - \frac{R_{109}}{R_{110}} \cdot I_{61}$$

$$= d \cdot \frac{1}{R_a} - \frac{R_{109}}{R_{110}} \cdot b \cdot C_0$$

Employing the current sources configured as mentioned above as the current sources 30 and 31 shown in FIG. 1 in the conditions of $I_A = I_{31}$ and $I_D = I_{30}$, and also employing the current source 39 shown in FIG. 2, the following relation can be established with regard to the active filter circuit shown in FIG. 1 according to the formulae 16, 18, 19 and 50:

$$Z_1 = \frac{1}{2} \times \frac{1}{C_1} \times \frac{1}{R_E + \frac{R_0}{a}} \times \frac{b}{a} \cdot R_a \cdot C_0 \times \frac{R_{109}}{R_{110}}, \quad (51)$$

$$V_o = \frac{Z_1}{j\omega + Z_1} \cdot V_i$$

Thus, a frequency characteristics of the filter never depend upon the absolute accuracy and ambient temperature of internal capacitors, and additionally, the frequency characteristics of the filter can be varied from the outside of the semiconductor integrated circuit by varying the ratio of resistance values of the external resistors $R_{109}$ and $R_{110}$.

Figure 8:
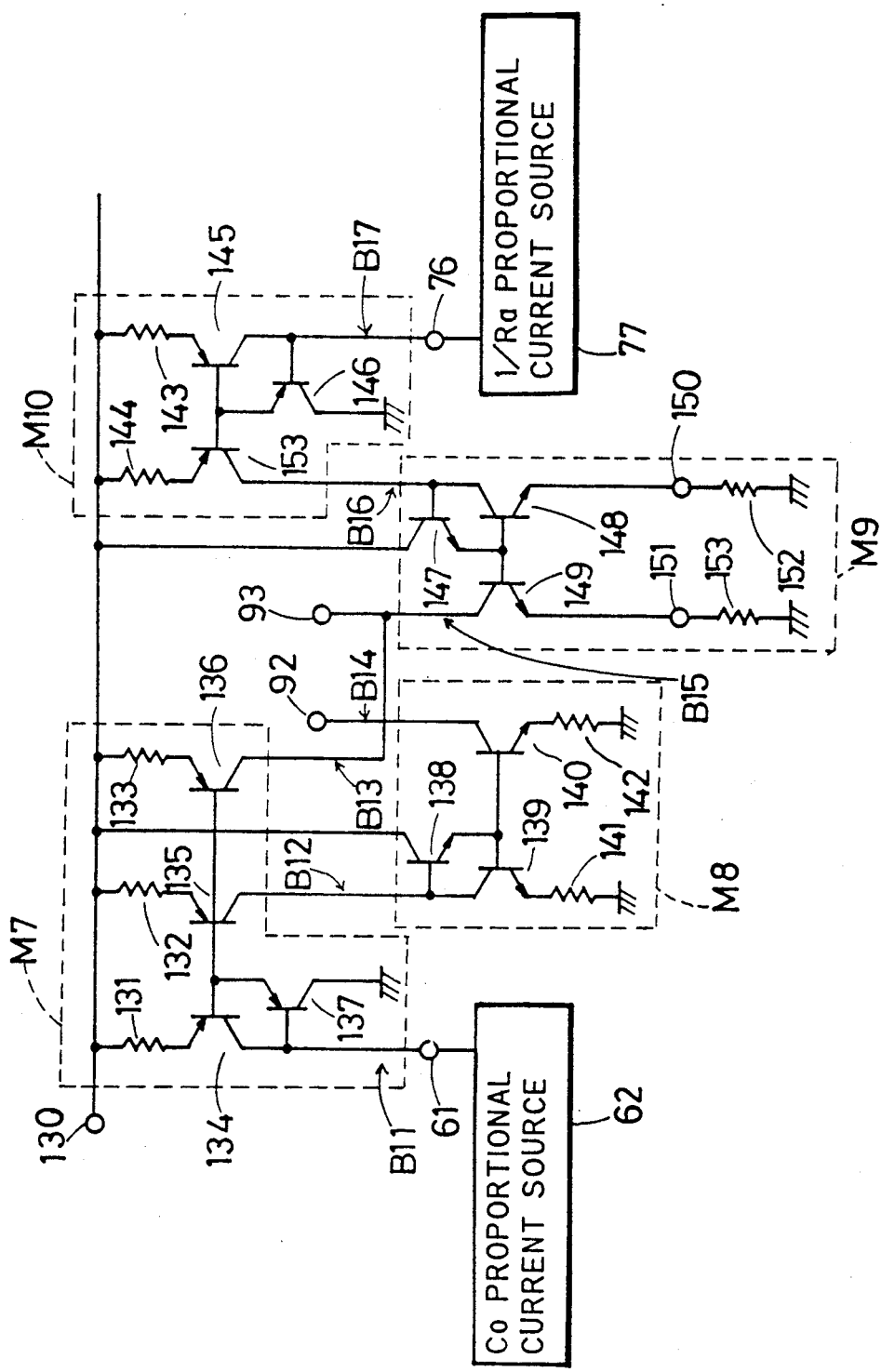
FIG. 8 is a circuit diagram showing a structure of the current sources 30 and 31.

FIG. 8 is a block diagram showing another configuration of current sources for producing the currents $I_{30}$ and $I_{31}$ which satisfy the relations expressed in the formula 16. The $C_0$ proportional current source 62 has its output connected through the terminal 61 to a reference branch B11 in a current mirror circuit M7. The current mirror circuit M7 has branches B12 and B13 which lead a current equivalent to the current led along the reference branch B11. The current mirror circuit M7 is connected through the branch B12 to a current mirror circuit M8 and also connected through the branch B13 to the terminal 93. The current mirror circuit M8 has the branch B12 serving as a reference and a branch B14 which leads a current equivalent to the current led along the reference branch B12, and the branch B14 is connected to the terminal 92.

The $1/R_a$ proportional current source 77 has its output connected through a branch B17 to a current mirror circuit M10 The current mirror circuit M10 has the branch B17 serving as a reference and a branch B16 which leads a current equivalent to the current led along the reference branch B17, and it is connected through the branch B16 to a current mirror circuit M9. The current mirror circuit M9 has the reference branch B16 and a branch B15 which leads a current equivalent to the current led along the reference branch B16, and it is connected through the branch B15 to the terminal 93.

To sum up, the current mirror circuits M7, M8, M9 and M10 perform the same operations, in turn, as the current mirror circuits M1 and M2 shown in FIG. 3 and the current mirror circuits M4 and M3 shown in FIG. 7.

The current mirror circuit M7 can be configured as mentioned below in FIG. 8. A PNP transistor 134 has its collector connected through a branch B11 to the terminal 61, its emitter connected through a resistor 131 to a power source terminal 130, and its base connected commonly to respective bases of PNP transistors 135 and 136.

The transistor 135 has its emitter connected through a resistor 132 to the power source terminal 130 and its collector connected through a branch B12 to the current mirror circuit M8. The transistor 136 has its emitter connected through a resistor 133 to the power source terminal $I_{30}$ and its collector connected through a branch B13 to the terminal 93. The PNP transistor 137 has its collector grounded and its base and emitter connected to a collector and a base of the transistor 134, respectively.

The current mirror circuit M8 can be configured as mentioned below in FIG. 8. An NPN transistor 139 has its collector connected through the branch B12 to the current mirror circuit M7, its base connected to a base of an NPN transistor 140, and its emitter grounded through a resistor 141.

The NPN transistor 140 has its collector connected through a branch B14 to the terminal 92, and its emitter grounded through a resistor 142. A transistor 138 has its collector connected to the power source terminal 130 and its base and emitter connected to a collector and a base of the transistor 139, respectively.

The current mirror circuit M9 can be configured as mentioned below in FIG. 8 An NPN transistor 149 has its collector connected through a branch B15 to the terminal 93, and its base connected to a base of an NPN transistor 148. The transistors 148 and 149 have their respective emitters connected to terminals 150 and 151, which, in turn, are grounded through external resistors 152 and 153. The transistor 148 has its collector connected through a branch B16 to the current mirror circuit M10. A PNP transistor 147 has its collector connected to the power source terminal 130 and its base and emitter connected to a collector and a base of the transistor 148, respectively.

The current mirror circuit M10 can be configured as mentioned below in FIG. 8. A PMP transistor 153 has its collector connected through a branch B16 to the current mirror circuit M9, its emitter connected through a resistor 144 to the power source terminal 130, and its base connected to a base of a PNP transistor 145.

The transistor 145 has its emitter connected through a resistor 143 to the power source terminal 130 and its collector connected through a branch B17 and a terminal 76 to the $1/R_a$ proportional current source 77. The PNP transistor 146 has its collector grounded and its base and emitter connected to a collector and a base of the transistor 145, respectively.

Then, the operation of the circuit will be described. Assuming that the resistors 131, 32 and 133 are all equal in resistance value and the transistors 134, 135 and 136 are all equal in transistor size in the current mirror circuit M7, the respective collector currents $I_{135C}$ and $I_{136C}$ of the transistors 135 and 136 (the currents led along the branches B12 and B13) can be expressed as follows:

$$I_{135C} = I_{136C} = I_{61} \tag{52}$$

Then, assuming that the resistors 141 and 142 are all euql in resistance value and the transistors 139 and 140 are equal in transistor size in the current mirror circuit M8, the collector current $I_{140C}$ of the transistor 140 (the current led along the branch B14) can be expressed as follows:

$$I_{140C} = I_{135C} \tag{53}$$

Thus, according to the formulae 41, 52 and 53, the current $I_A$ flowing in the terminal 92 becomes as follows:

$$I_A = I_{61} = b \cdot C_0 \tag{54}$$

Then, assuming that the resistors 143 and 144 are equal in resistance value in the current mirror circuit M10 and the transistors 145 and 153 are equal in transistor size, the collector current $I_{153C}$ of the transistor 153 (the current led along the branch B16) can be expressed as follows:

$$I_{153C} = I_{76} \tag{55}$$

Then, assuming that the transistors 148 and 149 are equal in transistor size and the external resistors 152 and 153 take resistance values $R_{152}$ and $R_{153}$ different from each other in the current mirror circuit M9, the respective emitter currents $I_{148E}$ and $I_{149E}$ of the transistors 148 and 149 have the relations as expressed in the following formula:

$$I_{148E} \times R_{152} \approx I_{149E} \times R_{153} \tag{56}$$

Thus, the following formula;

$$I_{149E} = \frac{R_{152}}{R_{153}} \cdot I_{148E} \tag{57}$$

can be obtained, and with regard to the branch B16, the following formula can also be obtained:

$$I_{148E} \approx I_{153} \tag{58}$$

Therefore, according to the formulae 55, 57 and 58, there can be obtained the formula as follows:

$$I_{149E} = \frac{R_{152}}{R_{153}} \cdot I_{76} \tag{59}$$

Since the collector current $I_{149C}$ of the transistor 149 is expressed as follows;

$$I_{149C} \approx I_{149E} \tag{60}$$

it will be found that the current $I_D$ flowing in the terminal 93 can be expressed as follows according to the formulae 41 and 59:

$$I_D = I_{149C} - I_{136C} \tag{61}$$

$$= \frac{R_{152}}{R_{153}} \cdot I_{76} - I_{61}$$

$$= \frac{R_{152}}{R_{153}} \cdot d \cdot \frac{1}{R_a} - b \cdot C_0$$

Thus, using the current sources configured as mentioned above as the current sources 30 and 31 shown in FIG. 1 in the conditions $I_{31} = I_A$ and $I_{30} = I_D$, and also employing the current source 39 shown in FIG. 2, the following relations can be obtained with regard to the active filter circuit shown in FIG. 1 according to the formulae 16, 18, 19 and 61:

$$Z_1 = \frac{1}{2} \times \frac{1}{C_1} \times \frac{1}{R_E + \frac{R_0}{a}} \times \frac{b}{d} \cdot R_a \cdot C_0 \times \frac{R_{153}}{R_{152}}, \tag{62}$$

$$V_o = \frac{Z_1}{j\omega + Z_1} \cdot V_i$$

In this way, a frequency characteristics of the filter never depend upon the absolute accuracy end ambient temperature of internal capacitors, and additionally, the frequency characteristic of the filter can be varied from the outside of the semiconductor integrated circuit by varying the ratio of resistance values of the external resistors $R_{153}$ and $R_{152}$.

Figure 9:
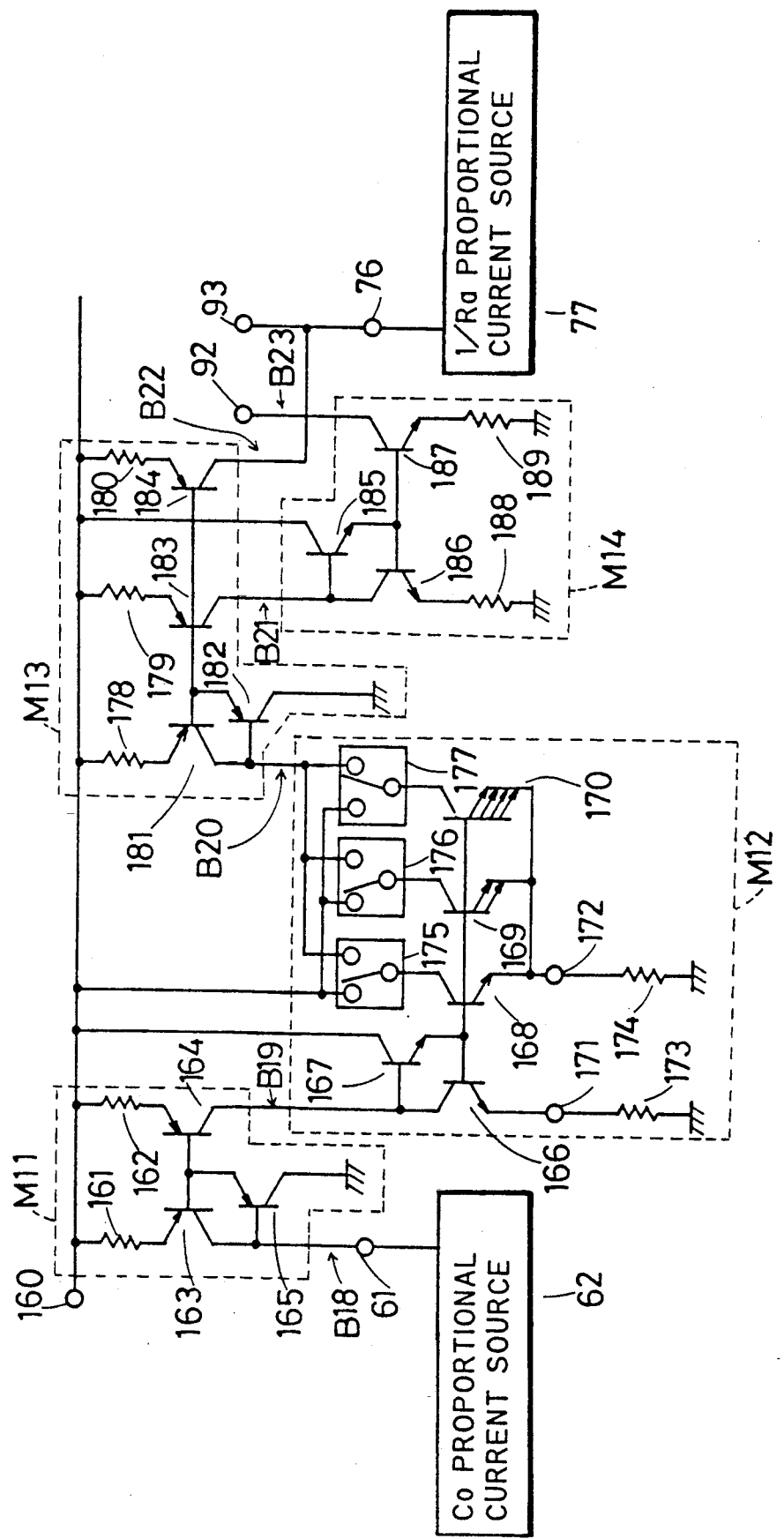
FIG. 9 is a circuit diagram showing a structure of the current sources 30 and 31.

FIG. 9 is a block diagram showing other structures of the current sources for producing the currents $I_{30}$ and $I_{31}$ which satisfy the relations expressed in the formula 16.

The $C_0$ proportional current source 62 has its output connected through the terminal 61 to a reference branch B18 in a current mirror circuit M11. The current mirror circuit M11 has a branch B19 which leads a current equivalent to the current led along the reference branch B18. A current mirror circuit M12 is connected through the branch B19 to the current mirror circuit M11. The current mirror circuit M12 has the branch B19 serving as a reference and a branch B20 which leads a current in proportion to the current led along the reference branch B19.

To sum up, the current mirror circuits M11 and M12 have the same connection relations to the $C_0$ proportional current source 62 as the current mirror circuits M3 and M4 shown in FIG. 7, respectively.

The $1/R_a$ proportional current source 77 is connected through a terminal 76 and a branch B22 to a current mirror circuit M13. A current mirror circuit M14 is connected through a branch B21 to the current mirror circuit M13 and also connected through a branch B23 to the terminal 92. The current mirror circuit M13 is connected through the branch B20 to the current mirror circuit M12 and also connected through the branch B22 to the terminal 93.

Herein, the current mirror circuit M13 allows the branches B21 and B22 to lead a current equivalent to the current led along the branch B20. The current mirror circuit M14 allows the branch B23 to lead a current equivalent to the current led along the branch B21. To sum up, the current mirror circuits M13 and M14 have the same connection relations to the $1/R_a$ proportional current source 77 as the current mirror circuits M5 and M6 shown in FIG. 7, respectively.

The current mirror circuit M11 can be configured as mentioned below in FIG. 9. A PNP transistor 163 has its collector connected through the branch B18 to the terminal 61, its emitter connected through a resistor 161 to a power source terminal 160, and its base connected to a base of a PNP transistor 164.

The transistor 164 has its emitter connected through a resistor 162 to the power source terminal 160 and its collector connected through the branch B19 to the current mirror circuit M12. A PNP transistor 165 has its collector grounded and its base and emitter connected to a collector and a base of the transistor 163, respectively.

The current mirror circuit M12 can be configured as mentioned below in FIG. 9. An NPN transistor 166 has its collector connected through the branch B19 to the current mirror circuit M11, and its base connected commonly to respective bases of NPN transistors 168, 169 and 170. The transistor 166 has its emitter connected to a terminal 171, and the transistors 168, 169 and 170 have their respective emitters connected commonly to the terminal 172. The terminals 171 and 172 are grounded through external resistors 173 and 174, respectively. A PNP transistor 167 has its collector connected to the power source terminal 160 and its base and emitter connected to a collector and a base of the transistor 166. The transistors 168, 169 and 170 have their respective collectors connected to respective inputs of switches 175, 176 and 177. The switches 175, 176 and 177 have their respective first output ends connected &o the power source terminal 160 and their respective second output ends connected through the branch B20 commonly to the current mirror circuit M13.

The current mirror circuit M13 can be configured as mentioned below in FIG. 9. A FMP transistor 181 has its collector connected through the branch B20 to the current mirror circuit M12, its emitter connected through a resistor 178 to the power source terminal 160, and its base connected commonly to respective bases of PNP transistors 183 and 184.

The transistor 183 has its emitter connected through a resistor 179 to the power source terminal 160 and its collector connected through the branch B21 to the current mirror circuit M14. The transistor 184 has its emitter connected through a resistance 180 to the power source terminal 160 and its collector connected through the branch B22 to the terminal 93. The PNP transistor 182 has its collector grounded and its base and emitter connected to a collector and a base of the transistor 181, respectively.

The current mirror circuit M14 can be configured as mentioned below in FIG. 9. An NPN transistor 186 has its collector connected through the branch B21 to the current mirror circuit M13, its base connected to a base of an NPN transistor 187, and its emitter grounded through a resistor 188.

An NPN transistor 187 has its collector connected through the branch B23 to the terminal 92 and its emitter grounded through a resistor 189. The transistor 185 has its collector connected to the power source terminal 160 and its base and emitter connected to a collector and a base of the transistor 186, respectively.

Then, the operation of the circuit will be described. Assuming that the resistors 161 and 162 are equal in resistance value and the transistors 163 and 164 are equal in transistor size in the current mirror circuit M11, the collector current $I_{164C}$ of the transistor 164 (the current led along the branch B19) can be expressed as follows:

$$I_{164C} = I_{61} \qquad (63)$$

Assuming that the external resistors 173 and 174 take resistance values $R_{173}$ and $R_{174}$ different from each other in the current mirror circuit M12, the respective emitter currents $I_{166E}$, $I_{168E}$, $I_{169E}$ and $I_{170E}$ of the transistors 166, 168, 169 and 170 have the relations among them as expressed below:

$$R_{173} \times I_{166E} \approx R_{174} \times (I_{168E} + I_{169E} + I_{170E}) \qquad (64)$$

Thus, the following formula can be established as follows;

$$I_{168E} + I_{169E} + I_{170E} = \frac{R_{173}}{R_{174}} \times I_{166E} \qquad (65)$$

and there is the relation as follows;

$$I_{166E} \approx I_{164C} \qquad (66)$$

and therefore, according to the formulae 63 to 66, there can be obtained the following formula:

$$I_{168E} + I_{169E} + I_{170E} = \frac{R_{173}}{R_{174}} \times I_{61} \qquad (67)$$

Now assuming that, when the transistor 168 is 1 in transistor size, the transistor 166 is 7 and the transistors 169 and 70 are 2 and 4 in transistor size, respectively, there are the relations as follows:

$$I_{169E} = 2 \times I_{168E}, \quad I_{170E} = 4 \times I_{168E} \qquad (68)$$

The collector current $I_{181C}$ of the transistor 181 (the current led along the branch B20) can be varied into $$I_{181C} = K \times I_{169E} \qquad (69)$$

by switching over &he switches 175, 176 and 177. In this case, K is an integer from 0 to 7, which is a selected value obtained by switching over the switches 175, 176 and 177 under the control from the outside.

For example, with regard to respective states X1, X2 and X3 of he switches 175, 176 and 177, a state where the switch connects to the power source terminal 160 is designated by a value "0" while a state here the switch connects to the current mirror circuit M13 is designated by a value "1", there are the relations between group of the states X1, X2 and X3 and the value K as expressed by the following formula:

$$K = X1 + 2 \cdot X2 + 4 \cdot X3 \qquad (70)$$

Assuming that the resistors 178, 179 and 180 are all equal in resistance value and the transistors 181, 183 and 184 are equal in transistor size in the current mirror circuit M13, the respective collector currents $I_{183C}$ and $I_{184C}$ of the transistors 183 and 184 (the currents led along the branches B21 and B22) can be expressed as follows:

$$I_{183} = I_{184C} = I_{181C} \qquad (71)$$

Thus, according to the formulae 67, 68, 69 and 71, the following formula can be obtained:

$$I_{183C} = I_{184C} = \frac{K}{7} \cdot \frac{R_{173}}{R_{174}} \times I_{61} \tag{72}$$

Then, assuming that the resistors 188 and 189 are equal in resistance value and the transistors 186 and 187 are equal in transistor size in the current mirror circuit M14, the collector current $I_{187C}$ of the transistor 187 (the current led along the branch B23), or the current $I_A$ flowing in the terminal 92 can be expressed as follows:

$$I_A = I_{187C} = I_{183C} = \frac{K}{7} \cdot \frac{R_{173}}{R_{174}} \times I_{61} \tag{73}$$

Hence, the current $I_D$ flowing in the terminal 93 can be expressed as follows:

$$I_D = I_{76} - I_{184C} = I_{76} - \frac{K}{7} \cdot \frac{R_{173}}{R_{174}} \cdot I_{61} \tag{74}$$

According to the formulae 41 and 74, the following formula;

$$I_D = b \cdot C_0 - \frac{K}{7} \cdot \frac{R_{173}}{R_{174}} \cdot I_{61} \tag{75}$$

can be obtained. Thus, employing the current sources configured as mentioned above as the current sources 30 and 31 in FIG. 1 in the conditions that $I_{31} = I_A$ and $I_{30} = I_D$, and also employing the current source 30 shown in FIG. 2, there is the relation with regard to the active filter circuit shown in FIG. 1 according to the formulae 16, 18, 19 and 75:

$$Z_1 = \frac{1}{2} \times \frac{1}{C_1} \times \frac{1}{R_E + \frac{R_0}{a}} \times \frac{b}{d} \cdot R_a \cdot C_0 \times \frac{K}{7} \cdot \frac{R_{173}}{R_{174}}, \tag{76}$$

$$V_o = \frac{Z_1}{j\omega + Z_1} V_i$$

In this way, a frequency characteristics of the filter never depend upon the absolute accuracy and ambient temperature of internal capacitors, and additionally, the frequency characteristic of the filter can be varied from the outside of the semiconductor integrated circuit by varying the ratio of resistance values of the external resistors $R_{173}$ and $R_{174}$. Also, the value K can be controlled by switching over the switches 175, 176 and 177 to further vary the frequency characteristics determined depending upon the above mentioned external resistance values $R_{173}$ and $R_{174}$. The control of the value K can be performed in a logical way, and therefore, the frequency characteristics of the filter can be prevented from being affected by variations of accuracy in manufacturing and temperature.

C) Applications to Other Active Filter Circuits

Although there has been described about a primary lowpass filter in the above section B), the present invention can be applied to other filters of which output potentials can generally be expressed by the formula 13, as described in the above section A). For example, if the potential $V_1$ is zero in the formula 13, the following relation is established;

$$V_0 = \frac{j\omega}{j\omega + Z} \cdot V_2 \tag{77}$$

and if $V_1 = -V_2$, the following relation is also established;

$$V_0 = \frac{j\omega - Z}{j\omega + Z} \cdot V_2 \tag{78}$$

and in those cases, the active filter circuit shown in FIG. 10 functions as a primary highpass filter and a primary allpass filter, respectively. In either case, applying the present invention, the intended effects can be attained though it is apparent according to the formula 17.

Moreover, the application of the present invention is effective even in secondary or higher order active filter circuits.

Figure 11:
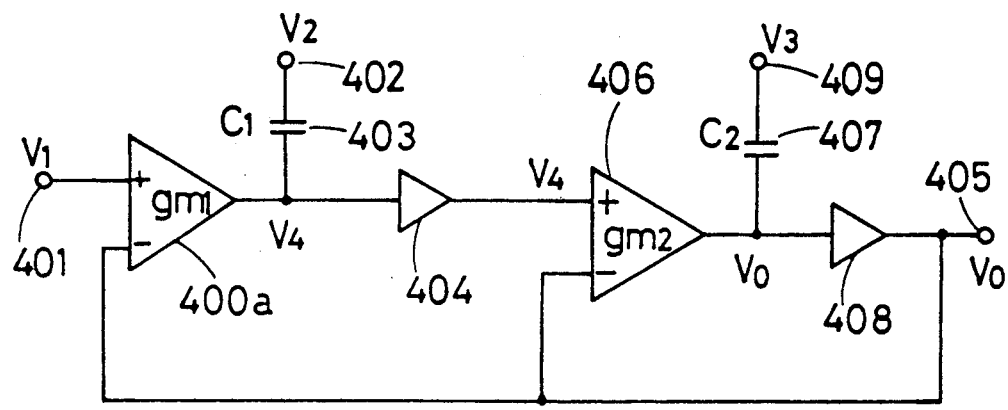
FIG. 11 is a circuit diagram for explaining the theory of the present invention.

FIG. 11 shows a general structure of the secondary active filter circuit. This is a configuration which includes a general structure of the primary active filter circuit shown in FIG. 10 connected to another primary active filter circuit. Specifically, a buffer 404 is connected to a positive input end of a converting circuit 406 having a variable gain $g_{m2}$ while a negative input end of the converting circuit 406 is connected to an output terminal 405. An output end of the converting circuit 406 is connected commonly to an input end of a buffer 408 and a first end of a capacitor 407. The buffer 408 has its output end connected to the output terminal 105 while the capacitor 407 has its second end connected to a third input terminal 409. Input voltage $V_3$ is applied to &he third input terminal 409.

In the active filter circuit configured as mentioned above, there is the relation as expressed by the following formula can be established (in FIG. 11, however, the equivalent to the converting circuit 400 in FIG. 10 is a converting circuit 400a having a variable gain $g_m1$):

$$V_0 = \frac{-\omega^2 V_3 + j\omega Z_2 V_2 + Z_1 Z_2 V_1}{-\omega^2 + j\omega Z_2 + Z_1 Z_2} \tag{79}$$

In this case, however, the following requirements must be satisfied:

$$Z_1 = g_{m1}/C_1, \quad Z_2 = g_{m2}/C_2 \tag{80}$$

Thus, when $V_2 = V_3 = 0$, the formula $$V_0 = \frac{Z_1 Z_2}{-\omega^2 + j\omega Z_2 + Z_1 Z_2} \cdot V_1 \tag{81}$$

is obtained. When $V_1 = V_2 = 0$, the formula $$V_0 = \frac{-\omega^2}{-\omega^2 + j\omega Z_2 + Z_1 Z_2} \cdot V_3 \tag{82}$$

is obtained. When $V_1 = V_3 = 0$, the formula $$V_0 = \frac{j\omega Z_2}{-\omega^2 + j\omega Z_2 + Z_1 Z_2} \cdot V_2 \tag{83}$$

is obtained. When $V_1=V_3$ and $V_1=-V_2$, the formula $$V_0 = \frac{-\omega^2 - j\omega Z_2 + Z_1 Z_2}{-\omega^2 + j\omega Z_2 + Z_1 Z_2} \cdot V_1 \qquad (84)$$

is obtained. Components corresponding to the above formulae function as a secondary lowpass filter secondary highpass filter, secondary bandpass filter, and secondary allpass filter, respectively. In this way, the application of the present invention to the converting circuits 400a and 406 can attain the effects of the present invention with regard to the values $Z_1$ and $Z_2$.

As has been described, according to the present invention, variations of a frequency characteristics can be inhibited, and an active filter without temperature dependency can be obtained.

In addition to the above-mentioned effects, the frequency characteristics can be set from the outside.

While the invention has been shown and described in detail, the foregoing description in all aspects illustrative and not restrictive. It is therefore understood that numerous modifications and variations can be devised without departing from the scope of the invention.

We claim:

1. An active filter circuit comprising:
   a voltage-current converting circuit having a variable gain and having a positive input end, a negative input end and an output end;
   a first input terminal connected to said positive input end;
   a buffer circuit having an input end connected to said output end of said voltage-current converting circuit, and an output end;
   a first capacitor having a first end connected to said input end of said buffer circuit and a second end, and having a first capacity;
   a second input terminal connected to said second end of said first capacitor;
   an output terminal connected in common to said output end of said buffer circuit and said negative input end of said voltage-current converting circuit;
   said voltage-current converting circuit including a first current source with two output ends leading first and second currents, a second current source producing a third current, and a pair of first internal resistors having a first resistance value;
   said first current source including a first compensating current source circuit and a second compensating current source circuit;
   said first compensating current source circuit including a second capacitor with a second capacity to produce a first compensating current in proportion to said second capacity;
   said second compensating current source circuit including a second internal resistor with a second resistance value to produce a second compensating current in inverse proportion to said second resistance value;
   said first current being in proportion to said first compensating current;
   said second current being in proportion to a difference between a current in proportion to said first compensating current and a current in proportion to said second compensating current;
   said second current source including a third internal resistor with a third resistance value to produce a third current which is in proportion to an inverse number of said third resistance value and in proportion to said ambient temperature converted into an absolute temperature;
   an active load;
   a differential amplifier connected to said active load; and
   first and second current drive transistors;
   said active load including first and second transistors and a third current source;
   said first transistor having a control electrode connected to a first one of said output ends to lead said first current in said first current source, a first current electrode connected to said first potential point and a second current electrode;
   said second transistor having a control electrode connect to a second one of said output ends to lead said second current in said first current source, a first current electrode connected through said fourth current source to said first potential point and connected to said output end of said voltage-current converting circuit, and a second current electrode;
   said third current source producing a dc component of the current lead by said second current electrode in said second transistor;
   said differential amplifier including third and fourth transistors;
   said third transistor having a control electrode connected to said positive input end, a first current electrode connected to said first potential point, and a second current electrode connected through a first one of said first internal resistors to a first end of said second current source;
   said fourth transistor having a control electrode connected to said negative input end, a first current electrode connected in common to said second current electrodes of said first and second transistors, and a second current electrode connected through a second one of said first internal resistors to said first end of said second current source;
   said first current drive transistor having a control electrode and a first current electrode connected with each other, and a second current electrode connected to said first output end of said first current source to lead said first current;
   said second current drive transistor having a control electrode and a first current electrode connected with each other, and a second current electrode connected to said second output end of said first current source to lead said first current; and
   said second current source having a second end connected to said second potential point.

2. An active filter circuit according to claim 1, wherein said buffer circuit includes a fifth transistor, a fourth current source, and third and fourth potential points;
   said fifth transistor having a control electrode connected to an input end of said buffer circuit, a first current electrode connected to said third potential point, and a second current electrode connected to an output end of said buffer circuit;
   said fourth current source including a first end connected to said second current electrode in said fifth transistor, and a second end connected to said fourth potential point.

3. An active filter circuit according to claim 2, wherein said second potential point is the ground.

4. An active filter circuit according to claim 3, wherein said second input terminal is connected to said second potential point.

5. An active filter circuit according to claim 3, wherein said first input terminal is connected to said second potential point.

6. An active filter circuit according to claim 3, wherein said first and second input terminals receive signals which are complementary with each other.

7. An active filter circuit according to claim 3, further comprising:
   a second voltage current converting circuit which has a second variable gain and includes a positive input end connected to said output end of said buffer circuit, a negative input end connected to said output terminal, and an output end;
   a second buffer circuit including an input end connected to said output end of said second voltage-current converting circuit, and an output end connected to said output terminal;
   a third capacitor having a first end connected to said input end of said second buffer circuit and a second end, and having a third capacity; and
   a third input terminal connected to said second end of said third capacitor.

8. An active filter circuit according to claim 7, wherein said second potential point is the ground.

9. An active filter circuit according to claim 8, wherein said second and third input terminals are connected in common to said second potential point.

10. An active filter circuit according to claim 8, wherein said first and second input terminals are connected commonly to said second potential point.

11. An active filter circuit according to claim 8, wherein said first and third input terminals are connected commonly to said second potential point.

12. An active filter circuit according to claim 8, wherein said first and third input terminals are connected to each other, and said first and second input terminals receive signals which are complementary with each other.

13. An active filter circuit according to claim 1, wherein said first current source further includes first and second current mirror circuits and a current branch:
   said first current mirror circuit including a first branch for leading a current equivalent to said first compensating current, a second branch for leading a current in proportion to the current led along said first branch, and a third branch connected to said current branch;
   said current branch leading a current in proportion to said second compensating current;
   said second mirror current circuit including a first branch connected to said second branch of said first current mirror circuit, and a second branch for leading a current in proportion to the current led along said first branch of said second current mirror circuit.

14. An active filter circuit according to claim 13, wherein either of said second and third branches of said first current mirror circuit leads a current equivalent to the current led along said first branch of said first current mirror circuit.

15. An active filter circuit according to claim 14, wherein said second branch of said second current mirror circuit leads a current equivalent to the current led by said first branch of said second current mirror circuit.

16. An active filter circuit according to claim 15, wherein said current branch is connected to said first compensating current source circuit.

17. An active filter circuit according to claim 15, wherein said first current source further includes third and fourth current mirror circuits;
   said third current mirror circuit including a first branch for leading a current equivalent to said second compensating current and a second branch for leading a current equivalent to the current led along said first branch;
   said fourth current mirror circuit including a first branch connected to said second branch of said third current mirror circuit, and a second branch for leading a current in proportion to the current led along said first branch of said fourth current mirror circuit;
   said second branch of said fourth current mirror circuit is equivalent to said current branch.

18. An active filter circuit according to claim 17, wherein said second branch of said third current mirror circuit leads a current equivalent to the current led along said first branch of said third current mirror circuit.

19. An active filter circuit according to claim 18, wherein said third branch of said second current mirror circuit is connected to said second branch of said fourth current mirror circuit.

20. An active filter circuit according to claim 19, wherein said fourth current mirror circuit further includes
   a first external resistor for leading a current almost equivalent to the current led along said first branch of said fourth current mirror circuit; and
   a second external resistor for leading a current almost equivalent to the current led along said second branch of said fourth current mirror circuit;
   the ratio of resistance values of said first and second external resistors determining the current led along said second branch.

21. An active filter circuit according to claim 1, wherein said first current source includes first, second, third and fourth current mirror circuits;
   said first current mirror circuit including a first branch for leading a current equivalent to said first compensating current, and a second branch for leading a current in proportion to the current led along said first branch;
   said second current mirror circuit including a first branch connected to said second branch of said first current mirror circuit, and a second branch for leading a current in proportion to the current led along said first branch of said second current mirror circuit;
   said third current mirror circuit including a first branch connected to said second branch of said second current mirror circuit, and second and third branches for leading a current in proportion to the current led along said first branch of said third current mirror circuit;
   said fourth current mirror circuit including a first branch connected to said second branch of said third current mirror circuit, and a second branch for leading a current in proportion to the current led along said first branch of said fourth current mirror circuit;

said third branch of said third current mirror circuit being connected to said first compensating current source circuit.

22. An active filter circuit according to claim 21, wherein said second branch of said first current mirror circuit leads a current equivalent to the current led along said first branch of said first current mirror circuit.

23. An active filter circuit according to claim 22, wherein either of said second and third branches of said third current mirror circuit leads a current equivalent to the current led along the first branch of said third current mirror circuit.

24. An active filter circuit according to claim 23, wherein said second branch of said fourth current mirror circuit leads a current equivalent &o the current led along said first branch of said fourth current mirror circuit.

25. An active filter circuit according to claim 24, wherein said second current mirror circuit further includes
- a first external resistor for leading a current almost equivalent to the current led along said first branch of said second current mirror circuit; and
- a second external resistor for leading a current almost equivalent to the current led along said second branch of said fourth current mirror circuit;
- the ratio of resistance values of said first and second external resistors determining the current led along said second branch.

26. An active filter circuit according to claim 25, wherein said second current mirror circuit further includes a plurality of output transistors and a plurality of switches;
- said switches having their respective first terminals connected in common to said first potential point, and respective second terminals connected in common to said second branch of said second current mirror circuit;
- said output transistors having their respective first current electrodes connected to respective said common terminals of said switches, respective second current electrodes connected in common to said second external resistor, and respective control electrodes connected together.

27. An active filter circuit according to claim 26, wherein said plurality of output transistors are three transistors which are sized to the rate 1, 2 and 4, respectively.

28. An active filter circuit according to claim 13, wherein said first compensating current source circuit further includes first and second pulse input terminals, a voltage comparator, a phase comparator, an input transistor, a fixed potential point, and a third current mirror circuit;
- said voltage comparator having a positive input end, a negative input end and an output end;
- said input transistor having a control electrode connected to said second pulse input terminal, a first current electrode connected to a first end of said second capacitor and said fixed potential point, and a second current electrode connected in common to a second end of said second capacitor and said positive input end of said voltage comparator:
- a bias potential being applied to said negative input terminal of said voltage comparator;
- said phase comparator having a first input end connected to said first pulse input terminal and a second input end connected to said output end of said voltage comparator;
- said third current mirror circuit having first and second branches connected to said positive input end of said voltage comparator and said output end of said phase comparator, respectively;
- said first and third branches of said third current mirror circuit lead a current in proportion to the current led along said second branch of said third current mirror circuit;
- said phase comparator causing current to flow in said output end of said phase comparator so that pulses applied to said first and second input terminals of said phase comparator is equal in width.

29. An active filter circuit according to claim 13, wherein said second compensating current source circuit further includes a reference transistor, an output transistor, a reference current source and a reference voltage source;
- said reference transistor having first current electrode and control electrode connected to each other, and a second current electrode connected to said reference voltage source;
- said reference current source being connected to said first current electrode of said reference transistor;
- said output transistor having a control electrode connected to said first current electrode of said reference transistor, a first current electrode for leading a current almost equivalent to the current led in said third internal resistor, and a second current electrode connected to said third internal resistor.

30. An active filter circuit according to claim 1, wherein said second current source further includes first and second current mirror circuits;
- said first current mirror circuit including a first output transistor, a first branch for leading a current led by said first output transistor, and a second branch for leading a current in proportion to the current led along said first branch of said first current mirror circuit;
- said second current mirror circuit including a second output transistor, a first branch connected to said first branch of said first current mirror circuit for leading a current led by said second output transistor, and second and third branches for leading a current in proportion to the current led along said first branch of said second current mirror circuit.
- said second output transistor including a first current electrode connected to said first branch of said first current mirror circuit, and a second current electrode grounded through said third internal resistor;
- said second branch of said second current mirror circuit being connected to said second branch of said first current mirror circuit.

* * * * *

UNITED STATES PATENT AND TRADEMARK OFFICE
CERTIFICATE OF CORRECTION

PATENT NO. : 5,311,141
DATED : MAY 10, 1994
INVENTOR(S) : TAKEHIKO UMEYAMA ET AL

It is certified that error appears in the above-indentified patent and that said Letters Patent is hereby corrected as shown below:

In column 28, line 13, change "said" to --a--.
In column 28, line 53, change "said" to --a--.

Signed and Sealed this

Seventh Day of March, 1995

Attest:

BRUCE LEHMAN

*Attesting Officer*     *Commissioner of Patents and Trademarks*